United States Patent
Ingram et al.

(10) Patent No.: US 12,352,895 B2
(45) Date of Patent: Jul. 8, 2025

(54) VARIABLE BEAM SPACING, TIMING, AND POWER FOR VEHICLE SENSORS

(71) Applicant: Waymo LLC, Mountain View, CA (US)

(72) Inventors: Benjamin Ingram, Santa Clara, CA (US); Pierre-Yves Droz, Los Altos, CA (US); Luke Wachter, San Francisco, CA (US); Scott McCloskey, Mountain View, CA (US); Blaise Gassend, East Palo Alto, CA (US); Gaetan Pennecot, San Francisco, CA (US)

(73) Assignee: Waymo LLC, Mountain View, CA (US)

( * ) Notice: Subject to any disclaimer, the term of this patent is extended or adjusted under 35 U.S.C. 154(b) by 334 days.

(21) Appl. No.: 17/722,092

(22) Filed: Apr. 15, 2022

(65) Prior Publication Data
US 2022/0244356 A1    Aug. 4, 2022

Related U.S. Application Data

(63) Continuation of application No. 16/827,214, filed on Mar. 23, 2020, now Pat. No. 11,333,746, which is a
(Continued)

(51) Int. Cl.
*G01S 7/481* (2006.01)
*G01S 7/484* (2006.01)
(Continued)

(52) U.S. Cl.
CPC .......... *G01S 7/4815* (2013.01); *G01S 7/484* (2013.01); *G01S 17/10* (2013.01); *G01S 17/931* (2020.01);
(Continued)

(58) Field of Classification Search
CPC ........ G01S 7/4815; G01S 7/484; G01S 17/10; H01S 5/4025; H01S 5/4056
See application file for complete search history.

(56) References Cited

U.S. PATENT DOCUMENTS

| 4,383,290 A | 5/1983 | Binder et al. |
| 4,386,854 A | 6/1983 | Byer |

(Continued)

FOREIGN PATENT DOCUMENTS

| JP | H07-159117 | 6/1995 |
| JP | H07-167958 | 7/1995 |

(Continued)

OTHER PUBLICATIONS

Canadian Intellectual Property Office, Office Action mailed on Nov. 3, 2020, issued in connection with Canadian Patent Application No. 3,056,418, 6 pages.
(Continued)

*Primary Examiner* — Thanh Luu
(74) *Attorney, Agent, or Firm* — McDonnell Boehnen Hulbert & Berghoff LLP

(57) ABSTRACT

The present disclosure relates to systems and methods that facilitate light detection and ranging operations. An example transmit block includes at least one substrate with a plurality of angled facets. The plurality of angled facets provides a corresponding plurality of elevation angles. A set of angle differences between adjacent elevation angles includes at least two different angle difference values. A plurality of light-emitter devices is configured to emit light into an environment along the plurality of elevation angles toward respective target locations so as to provide a desired resolution and/or a respective elevation angle. The present
(Continued)

disclosure also relates to adjusting shot power and a shot schedule based on the desired resolution and/or a respective elevation angle.

20 Claims, 20 Drawing Sheets

Related U.S. Application Data continuation of application No. 16/145,909, filed on Sep. 28, 2018, now Pat. No. 10,634,769, which is a continuation of application No. 16/030,514, filed on Jul. 9, 2018, now Pat. No. 10,416,290, which is a continuation of application No. 15/900,189, filed on Feb. 20, 2018, now Pat. No. 10,365,351.

(60) Provisional application No. 62/473,311, filed on Mar. 17, 2017.

(51) Int. Cl.
  *G01S 17/10* (2020.01)
  *G01S 17/931* (2020.01)
  *H01S 5/40* (2006.01)
  *H01S 3/23* (2006.01)

(52) U.S. Cl.
  CPC .......... *H01S 5/4025* (2013.01); *H01S 5/4056* (2013.01); *H01S 3/2308* (2013.01)

(56) References Cited

U.S. PATENT DOCUMENTS

| | | |
|---|---|---|
| 5,013,151 A | 5/1991 | Hughes |
| 5,149,191 A | 9/1992 | Lewin et al. |
| 5,383,102 A | 1/1995 | Jones |
| 5,424,717 A | 6/1995 | Platt et al. |
| 5,557,395 A | 9/1996 | Uno et al. |
| 5,682,229 A | 10/1997 | Wangler |
| 5,773,813 A | 6/1998 | Duchon et al. |
| 6,906,659 B1 | 6/2005 | Ramstack |
| 7,559,672 B1 | 7/2009 | Parkyn et al. |
| 7,544,945 B2 | 9/2009 | Tan et al. |
| 7,969,558 B2 | 6/2011 | Hall |
| 8,269,652 B2 | 9/2012 | Seder et al. |
| 8,485,037 B1 | 6/2013 | Takacs et al. |
| 8,814,385 B2 | 8/2014 | Onaka et al. |
| 8,836,922 B1 | 9/2014 | Pennecot et al. |
| 9,128,190 B1 | 9/2015 | Ulrich et al. |
| 9,134,019 B2 | 9/2015 | Thomas et al. |
| 9,383,753 B1 | 7/2016 | Templeton et al. |
| 2002/0067474 A1 | 6/2002 | Uomori et al. |
| 2002/0140924 A1 | 10/2002 | Wangler et al. |
| 2004/0136190 A1* | 7/2004 | Christoph .............. G02B 21/06 362/235 |
| 2005/0036529 A1 | 2/2005 | Monson et al. |
| 2005/0207152 A1* | 9/2005 | Maxik .................... F21K 9/232 362/240 |
| 2006/0087640 A1 | 4/2006 | Yamaguchi |
| 2006/0132752 A1 | 6/2006 | Kane et al. |
| 2007/0035624 A1 | 2/2007 | Lubard et al. |
| 2007/0116077 A1 | 5/2007 | Farmer et al. |
| 2008/0002176 A1 | 1/2008 | Krasutsky et al. |
| 2008/0285842 A1 | 11/2008 | Plasberg et al. |
| 2009/0010644 A1 | 1/2009 | Varshneya et al. |
| 2011/0040482 A1 | 2/2011 | Brimble et al. |
| 2011/0255279 A1 | 10/2011 | Finkelstein et al. |
| 2011/0317414 A1 | 12/2011 | Marfeld et al. |
| 2012/0182732 A1* | 7/2012 | Moeck ................... F21V 29/70 362/235 |
| 2012/0183119 A1 | 7/2012 | Ikhlef et al. |
| 2012/0319616 A1 | 12/2012 | Quilici et al. |
| 2013/0021812 A1 | 1/2013 | Schug et al. |
| 2013/0107530 A1 | 5/2013 | Wyrick et al. |
| 2013/0148684 A1 | 6/2013 | Guo et al. |
| 2014/0140052 A1* | 5/2014 | Villard .................... F21V 14/02 362/225 |
| 2014/0347651 A1 | 11/2014 | Malone et al. |
| 2015/0003060 A1 | 1/2015 | Bijlsma et al. |
| 2015/0035437 A1 | 2/2015 | Panopoulous et al. |
| 2015/0036340 A1 | 2/2015 | Schwaighofer et al. |
| 2015/0055117 A1* | 2/2015 | Pennecot .............. G01S 7/4816 356/4.01 |
| 2015/0124225 A1 | 5/2015 | Akiyama |
| 2015/0131080 A1 | 5/2015 | Retterath et al. |
| 2015/0131281 A1 | 5/2015 | Romeu et al. |
| 2015/0160345 A1 | 6/2015 | Hines |
| 2015/0226853 A1 | 8/2015 | Seo et al. |
| 2016/0261854 A1 | 9/2016 | Ryu et al. |
| 2016/0291136 A1 | 10/2016 | Lindskog et al. |
| 2016/0327647 A1 | 11/2016 | Herbst et al. |
| 2017/0102704 A1 | 4/2017 | O'Brien et al. |
| 2017/0146640 A1 | 5/2017 | Hall et al. |
| 2017/0219695 A1 | 8/2017 | Hall et al. |
| 2017/0243373 A1 | 8/2017 | Bevensee et al. |
| 2017/0269197 A1 | 9/2017 | Hall et al. |
| 2017/0269198 A1 | 9/2017 | Hall et al. |
| 2017/0269209 A1 | 9/2017 | Hall et al. |
| 2017/0269215 A1 | 9/2017 | Hall et al. |
| 2017/0350983 A1 | 12/2017 | Hall et al. |
| 2018/0113200 A1 | 4/2018 | Steinberg et al. |
| 2018/0164408 A1 | 6/2018 | Hall et al. |
| 2018/0164439 A1 | 6/2018 | Droz et al. |
| 2018/0180722 A1 | 6/2018 | Pei et al. |
| 2018/0252513 A1 | 9/2018 | Takashima |
| 2018/0259623 A1 | 9/2018 | Donovan |
| 2018/0267151 A1 | 9/2018 | Hall et al. |
| 2018/0284227 A1 | 10/2018 | Hall et al. |
| 2018/0299553 A1 | 10/2018 | Takemoto et al. |
| 2018/0321360 A1 | 11/2018 | Hall et al. |
| 2019/0195990 A1 | 6/2019 | Shand |

FOREIGN PATENT DOCUMENTS

| | | |
|---|---|---|
| JP | H09-270531 | 10/1997 |
| JP | 2000101202 | 4/2000 |
| JP | 2004247461 | 9/2004 |
| JP | 2008281427 | 11/2008 |
| JP | 2009081193 | 4/2009 |
| JP | 2010091855 | 4/2010 |
| JP | 2013033938 | 2/2013 |
| JP | 5421799 | 2/2014 |
| JP | 2014192450 | 10/2014 |
| JP | 2015169541 | 11/2016 |
| WO | 2012/117542 | 9/2012 |
| WO | 2016/117108 | 7/2016 |
| WO | 2016/160961 | 10/2016 |
| WO | 2016164131 A1 | 10/2016 |

OTHER PUBLICATIONS

European Patent Office, Extended European Search Report mailed on Feb. 19, 2021, issued in connection with European Patent Application No. 1876793.7, 18 pages.

European Patent Office, Partial Supplementary European Search Report mailed on Oct. 20, 2020, issued in connection with European Patent Application No. 1876793.7, 18 pages.

Intellectual Property Office of Singapore, Office Action including Search Report and Written Opinion mailed on Apr. 28, 2020, issued in connection with Singapore Patent Application No. 11201907861W, 11 pages.

Kim et al., "LiDAR sensor technology trends and applications—Trends and Application on Lidar Sensor Technology," Electronics and Telecommunications Trends, 2012, 20 pages (with Machine Translation).

Innovation, Science and Economic Development Canada, Examination Report mailed on May 8, 2024, issued in connection with Canadian Patent Application No. 3,185,078, 5 pages.

\* cited by examiner

VARIABLE BEAM SPACING, TIMING, AND POWER FOR VEHICLE SENSORS

CROSS-REFERENCE TO RELATED APPLICATION

The present patent application is a continuation of U.S. patent application Ser. No. 16/827,214 filed on Mar. 23, 2020, which is a continuation of U.S. patent application Ser. No. 16/145,909 filed on Sep. 28, 2018, which is a continuation of U.S. patent application Ser. No. 16/030,514 filed on Jul. 9, 2018, which is a continuation of U.S. patent application Ser. No. 15/900,189 filed on Feb. 20, 2018, which claims priority to U.S. Patent Application No. 62/473,311 filed on Mar. 17, 2017, the contents of each of which are hereby incorporated by reference. The present application is also related to, but does not claim priority to, U.S. patent application Ser. No. 16/828,773, filed on Mar. 24, 2020.

BACKGROUND

Unless otherwise indicated herein, the materials described in this section are not prior art to the claims in this application and are not admitted to be prior art by inclusion in this section.

Vehicles can be configured to operate in an autonomous mode in which the vehicle navigates through an environment with little or no input from a driver. Such autonomous vehicles can include one or more sensors that are configured to detect information about the environment in which the vehicle operates.

One such sensor is a light detection and ranging (LIDAR) device. A LIDAR can estimate distance to environmental features while scanning through a scene to assemble a "point cloud" indicative of reflective surfaces in the environment. Individual points in the point cloud can be determined by transmitting a laser pulse and detecting a returning pulse, if any, reflected from an object in the environment, and determining the distance to the object according to the time delay between the transmitted pulse and the reception of the reflected pulse. A laser, or set of lasers, can be rapidly and repeatedly scanned across a scene to provide continuous real-time information on distances to reflective objects in the scene. Combining the measured distances and the orientation of the laser(s) while measuring each distance allows for associating a three-dimensional position with each returning pulse. In this way, a three-dimensional map of points indicative of locations of reflective features in the environment can be generated for the entire scanning zone.

SUMMARY

The present disclosure generally relates to light-emitting systems configured to provide pulses of laser light. For example, the present disclosure may relate to light detection and ranging (LIDAR) systems that may be implemented in vehicles, such as autonomous and semi-autonomous automobiles, trucks, motorcycles, and other types of vehicles that can move within their respective environments.

In a first aspect, a system is provided. The system includes at least one substrate. The at least one substrate includes a plurality of angled facets along a front edge. The at least one substrate further includes a die attach location corresponding to each angled facet. The plurality of angled facets provides a corresponding plurality of elevation angles. A set of angle differences between adjacent elevation angles includes at least two different angle difference values. The system also includes a plurality of light-emitter devices. The respective light-emitter devices are coupled to respective die attach locations according to a respective elevation angle of the respective angled facet. The plurality of light-emitter devices is configured to emit light into an environment along the plurality of elevation angles toward respective target locations.

In a second aspect, a method of manufacturing is provided. The method includes providing at least one substrate. The at least one substrate includes a plurality of angled facets along a front edge and a die attach location corresponding to each angled facet. The plurality of angled facets provides a corresponding plurality of elevation angles. A set of angle differences between adjacent elevation angles includes at least two different angle difference values. The method also includes attaching a plurality of light-emitter devices to respective die attach locations. The attaching is performed according to a respective elevation angle of the respective angled facet. The method also includes electrically connecting each respective light-emitter device of the plurality of light-emitter devices to a respective pulser circuit. The method additionally includes optically coupling each respective light-emitter device of the plurality of light-emitter devices to a respective lens.

In a third aspect, a method is provided. The method includes determining an elevation angle of a given light-emitter device of a plurality of light-emitter devices. Respective light-emitter devices are coupled to respective die attach locations corresponding to respective angled facets of a plurality of angled facets disposed along a front edge of at least one substrate. The method also includes determining a desired power output level of the given light-emitter device based on the determined elevation angle. The method also includes causing the given light-emitter device to emit at least one light pulse into an environment toward a target location according to the desired power output level.

In a fourth aspect, a method is provided. The method includes determining an anticipated target range of a given light-emitter device of a plurality of light-emitter devices. Respective light-emitter devices are coupled to respective die attach locations corresponding to respective angled facets of a plurality of angled facets disposed along a front edge of at least one substrate. The method also includes determining a desired power output level of the given light-emitter device based on the determined anticipated target range. The method yet further includes causing the given light-emitter device to emit at least one light pulse into an environment toward a target location according to the desired power output level.

In a fifth aspect, a method is provided. The method includes determining a respective elevation angle for each light-emitter device of a plurality of light-emitter devices. The respective light-emitter devices are coupled to respective die attach locations corresponding to respective angled facets of a plurality of angled facets disposed along a front edge of at least one substrate. The method also includes determining a desired shot schedule of the plurality of light-emitter devices based on the determined elevation angles. The method yet further includes causing the plurality of light-emitter devices to emit light pulses into an environment toward a target region according to the desired shot schedule.

In a sixth aspect, a method is provided. The method includes determining an anticipated target range for each light-emitter device of a plurality of light-emitter devices. Respective light-emitter devices are coupled to respective die attach locations corresponding to respective angled facets of a plurality of angled facets disposed along a front edge of at least one substrate. The method includes determining a desired shot schedule of the plurality of light-emitter devices based on the respective anticipated target ranges. The method also includes causing the plurality of light-emitter devices to emit light pulses into an environment toward a target region according to the desired shot schedule.

In a seventh aspect, a system is provided. The system includes a plurality of light-emitter devices of a light detection and ranging system of a vehicle. Each light-emitter device of the plurality of light-emitter devices is configured to emit light pulses along a respective beam elevation angle. The plurality of light-emitter devices are arranged such that a combination of the respective beam elevation angles includes a non-uniform beam elevation angle distribution. At least one angle difference between respective beam elevation angles of two adjacent light-emitter devices having elevation angles below a reference plane is larger than at least one angle difference between respective beam elevation angles of two adjacent light-emitter devices having elevation angles above the reference plane. The reference plane is based on an axis of motion of the vehicle.

Other aspects, embodiments, and implementations will become apparent to those of ordinary skill in the art by reading the following detailed description, with reference where appropriate to the accompanying drawings.

DETAILED DESCRIPTION

Figure 1A:
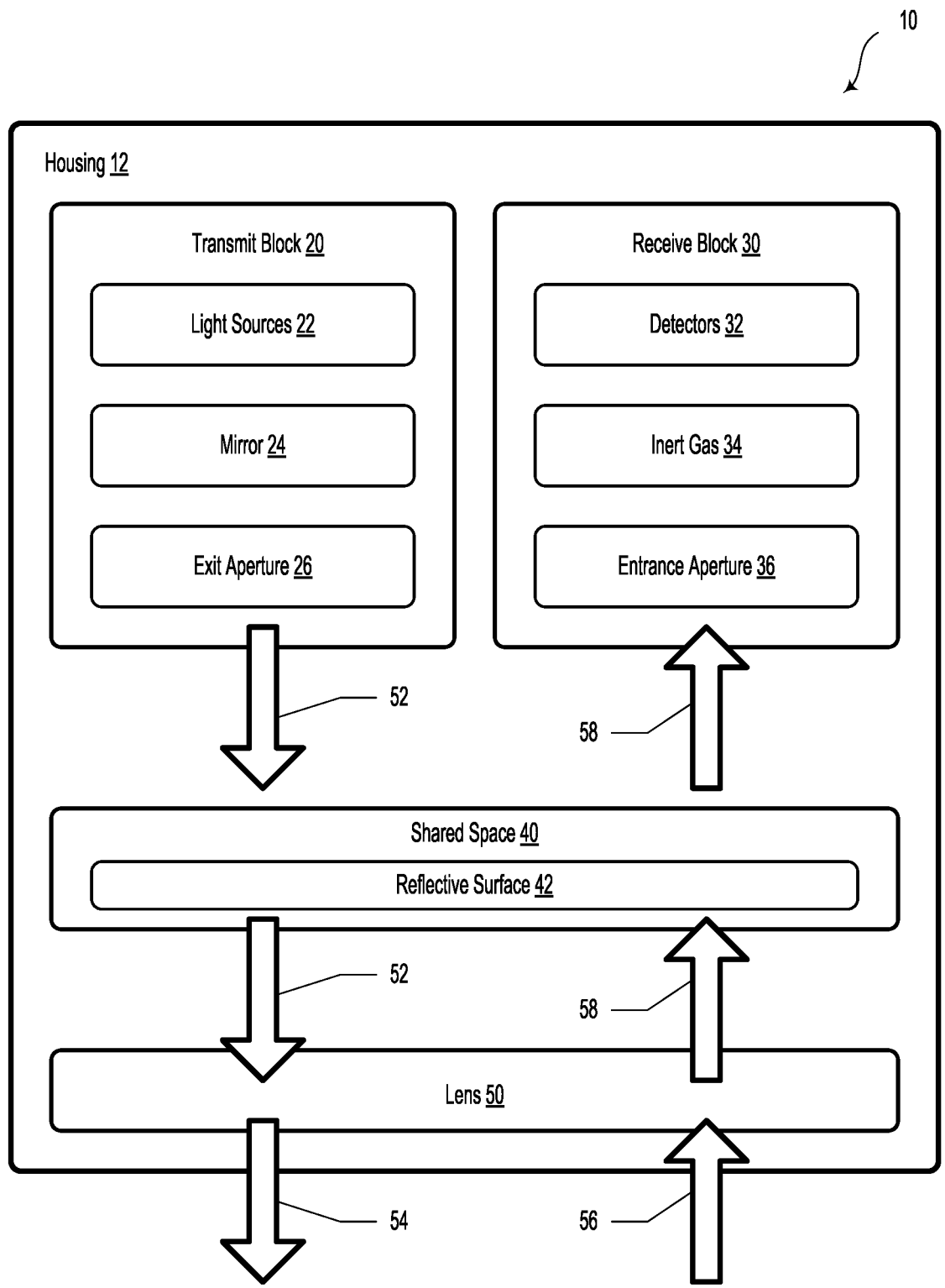
FIG. 1A illustrates a sensing system, according to an example embodiment.

Example methods, devices, and systems are described herein. It should be understood that the words "example" and "exemplary" are used herein to mean "serving as an example, instance, or illustration." Any embodiment or feature described herein as being an "example" or "exemplary" is not necessarily to be construed as preferred or advantageous over other embodiments or features. Other embodiments can be utilized, and other changes can be made, without departing from the scope of the subject matter presented herein.

Thus, the example embodiments described herein are not meant to be limiting.

Aspects of the present disclosure, as generally described herein, and illustrated in the figures, can be arranged, substituted, combined, separated, and designed in a wide variety of different configurations, all of which are contemplated herein.

Further, unless context suggests otherwise, the features illustrated in each of the figures may be used in combination with one another. Thus, the figures should be generally viewed as component aspects of one or more overall embodiments, with the understanding that not all illustrated features are necessary for each embodiment.

I. Overview

In an effort to increase imaging resolution in light detection and ranging (LIDAR) systems, such systems may increase a quantity of sensing devices and/or light-emitting devices, which may be expensive. Optionally, a shot rate of the light-emitting devices may be increased, which may increase the output power of the system and be supported by additional cooling capabilities (e.g., heatsinks, liquid cooling, etc.). Increasing the number of shots and light pulse detections in a given period of time also may need greater computational power to process.

Instead of simply increasing a number of light-emitting devices and sensing devices at evenly-spaced angle intervals to obtain better resolution within a given field of view, example systems and methods described herein concentrate more sensing devices and/or light-emitting devices at specific angles or ranges of angles, such as angles that relate to beams emitted from a transmit block of a LIDAR system that point ahead of a vehicle or up, and utilize fewer sensors or light-emitters oriented at other angles. For example, beams that point downward hit the ground at relatively close range. Accordingly, to see an object of a certain size (e.g., 5 cm tall or 12 cm tall), the downward facing beams can be spaced more sparsely (in angular terms with respect to the LIDAR system) as compared to beams that generally travel longer distances. This, in turn, provides a capability to view similar sized objects within a range of distances away from the vehicle. Additionally or alternatively, embodiments described herein may provide an opportunity to reduce the number of sensing devices or light-emitting devices. Yet further, embodiments disclosed herein may provide greater spatial resolution for a given number of sensing devices or light-emitting devices.

Some embodiments of the present disclosure may include varying the amount of power per shot based on an orientation of a given light-emitting device. That is, light-emitting devices that emit relatively close range beams (e.g., beams emitted at downward angles) need lower power than longer range beams. Put in other words, a minimum amount of photons needed to resolve a given feature scales as a square of the range. Accordingly, compared to an "average" shot, beams that travel only half of the distance to their target may need only a quarter of the power per shot to detect a given object with similar accuracy. By varying the amount of power based on an orientation angle of a given light-emitting device, the LIDAR device may be more power efficient.

In conventional LIDAR systems, a shot rate may be implemented uniformly across all of the light-emitting devices, without regard to a maximum detection distance. In the present disclosure, some embodiments have a shot schedule, shot rate, and/or a shot interval that may be varied based on the orientation of a given light-emitting device or the angle of the beam to be detected. That is, as described above, light pulses in downward-oriented beams travel shorter distances and therefore the detector may receive a corresponding reflected pulse faster than similar pulses that travel longer distances due to different times of flight. Accordingly, light-emitting devices and detectors assigned to lower angle beams may be assigned a different duty cycle (e.g., less return wait time) compared to higher angle beams at least because closer-range beams will generally provide faster return signals. Thus, after emitting a light pulse, lower angle emitter/detector pairs may have a shorter delay or narrower window before emitting a subsequent light pulse. That is, adjacent lower angle emitters may fire in closer succession to one another as compared to higher angle emitters due, at least in part, to a shorter "listening window" during which a corresponding detector may receive reflected light from a given light pulse. When a given light pulse is limited in its potential time of flight (e.g., because the light-emitter device is angled toward the ground), such a listening window may be shortened in duration. In some embodiments, by waiting a shorter amount of time between light pulses and/or before firing an adjacent light-emitter device, systems and methods described herein may emit more light pulses in a given amount of time, which may provide higher horizontal resolution or faster whole-scene update rates.

Systems and methods described herein may include transmit blocks of LIDAR systems that provide variable beam spacing, shot timing (e.g., shot scheduling), and shot power, each of which may be based on variables such as: sensor height, total number of beams, desired object size, minimum possible spacing between beams, range of slope changes (e.g. +3% change in grade, flat ground, −3% change in grade), minimum shot power, and shot power margin.

In some embodiments, beams may be spaced such that a desired spacing exists between beams at a given distance from the LIDAR system. For example, the desired spacing may be between 5 and 12 centimeters at 10-50 meters from the LIDAR system on flat ground or from a surface (e.g., a front bumper) of a given vehicle supporting the LIDAR system.

In an example embodiment, beams may be spaced such that on flat ground, resolution is approximately 9.7 cm vertical spacing out to approximately 25 m from the vehicle. At longer ranges, vertical spacing may increase gradually (e.g., linearly) until obtaining a particular, minimum spacing (e.g., 0.167 degrees), which may correspond to a physical limitation of die attach locations, light-emitter die size, and/or the substrate space and substrate shape. The slope of the linear increase could be set based on a given number of emitters. In an example embodiment, the slope of the linear increase could be based on 50-100 emitters (e.g., 64 emitters). However, more or fewer emitters are possible within the scope of the present disclosure. Furthermore, other slopes and arrangements of beams are possible. In some cases, the system may be elevated from the ground at heights of 1-5 meters. By spacing beams as described herein, the peak vertical resolution may be increased from 0.317 degrees to 0.167 degrees and the peak horizontal resolution may be increased by about ~50%, from 0.180 degrees to 0.131 degrees, as compared to LIDAR devices with uniform beam angle spacing.

In other embodiments, assuming even a −15% grade change, at least 7.5 cm vertical spacing may be achieved at 25 meters for beams at lower elevation until hitting a minimum angle spacing of 0.72 degrees. For example, for a 1.1 meter sensor height, a shot timing or shot schedule may be adjusted to achieve a desired resolution at specific ranges from the sensor unit. For example, in some embodiments, the total number of shots may be reduced by 35%. Furthermore, as described herein, the power of each shot may be adjusted based on an anticipated target range and/or an elevation angle of the given light-emitter device. In an example embodiment, the power of each shot (or the power of each shot for a given light-emitter device) may be adjusted to provide a 20% shot power margin and 10% minimum power. In some embodiments, in combination with the reduced shot count, reductions in power per shot may reduce the laser power usage by ~45%. It will be understood that other amounts of reductions of power per shot are possible.

II. Example Systems

FIG. 1A illustrates a sensing system 10, according to an example embodiment. The sensing system 10 may be a light detection and ranging (LIDAR) system. The sensing system includes a housing 12 that houses an arrangement of various components, such as a transmit block 20, a receive block 30, a shared space 40, and a lens 50. The sensing system 10 includes an arrangement of components configured to provide emitted light beams 52 from the transmit block 20 that are collimated by the lens 50 and transmitted into an environment of the sensing system 10 as collimated light beams 54. Furthermore, the sensing system 10 includes an arrangement of components configured to collect reflected light 56 from one or more objects in the environment of the sensing system 10 by the lens 50 for focusing towards the receive block 30 as focused light 58. The reflected light 56 includes light from the collimated light beams 54 that was reflected by the one or more objects in the environment of the sensing system 10.

The emitted light beams 52 and focused light 58 may traverse the shared space 40 also included in the housing 10. In some embodiments, the emitted light beams 52 propagate along a transmit path through the shared space 40 and the focused light 58 propagates along a receive path through the shared space 40.

The sensing system 10 can determine an aspect of the one or more objects (e.g., location, shape, etc.) in the environment of the sensing system 10 by processing the focused light 58 received by the receive block 30. For example, the sensing system 10 can compare a time when pulses included in the emitted light beams 52 were emitted by the transmit block 20 with a time when corresponding pulses included in the focused light 58 were received by the receive block 30 and determine the distance between the one or more objects and the sensing system 10 based on the comparison.

The housing 12 included in the sensing system 10 can provide a platform for mounting the various components included in the sensing system 10. The housing 12 can be formed from any material capable of supporting the various components of the sensing system 10 included in an interior space of the housing 12. For example, the housing 12 may be formed from a structural material such as plastic or metal.

In some examples, the housing 12 may include optical shielding configured to reduce ambient light and/or unintentional transmission of the emitted light beams 52 from the transmit block 20 to the receive block 30. The optical shielding can be provided by forming and/or coating the outer surface of the housing 12 with a material that blocks the ambient light from the environment. Additionally, inner surfaces of the housing 12 can include and/or be coated with the material described above to optically isolate the transmit block 20 from the receive block 30 to prevent the receive block 30 from receiving the emitted light beams 52 before the emitted light beams 52 reach the lens 50.

In some examples, the housing 12 can be configured for electromagnetic shielding to reduce electromagnetic noise (e.g., Radio Frequency (RF) Noise, etc.) from ambient environment of the sensor system 10 and/or electromagnetic noise between the transmit block 20 and the receive block 30. Electromagnetic shielding can improve quality of the emitted light beams 52 emitted by the transmit block 20 and reduce noise in signals received and/or provided by the receive block 30. Electromagnetic shielding can be achieved by forming and/or coating the housing 12 with one or more materials such as a metal, metallic ink, metallic foam, carbon foam, or any other material configured to appropriately absorb or reflect electromagnetic radiation. Metals that can be used for the electromagnetic shielding can include for example, copper or nickel.

In some examples, the housing 12 can be configured to have a substantially cylindrical shape and to rotate about an axis of the sensing system 10. For example, the housing 12 can have the substantially cylindrical shape with a diameter of approximately 10 centimeters. In some examples, the axis is substantially vertical. By rotating the housing 12 that includes the various components, in some examples, a three-dimensional map of a 360 degree view of the environment of the sensing system 10 can be determined without frequent recalibration of the arrangement of the various components of the sensing system 10. Additionally or alternatively, the sensing system 10 can be configured to tilt the axis of rotation of the housing 12 to control the field of view of the sensing system 10.

Although not illustrated in FIG. 1A, the sensing system 10 can optionally include a mounting structure for the housing 12. The mounting structure can include a motor or other means for rotating the housing 12 about the axis of the sensing system 10. Alternatively, the mounting structure can be included in a device and/or system other than the sensing system 10.

In some examples, the various components of the sensing system 10 such as the transmit block 20, receive block 30, and the lens 50 can be removably mounted to the housing 12 in predetermined positions to reduce burden of calibrating the arrangement of each component and/or subcomponents included in each component. Thus, the housing 12 acts as the platform for the various components of the sensing system 10 to provide ease of assembly, maintenance, calibration, and manufacture of the sensing system 10.

The transmit block 20 includes a plurality of light sources 22 that can be configured to emit the plurality of emitted light beams 52 via an exit aperture 26. In some examples, each of the plurality of emitted light beams 52 corresponds to one of the plurality of light sources 22. The transmit block 20 can optionally include a mirror 24 along the transmit path of the emitted light beams 52 between the light sources 22 and the exit aperture 26.

The light sources 22 can include laser diodes, light emitting diodes (LED), vertical cavity surface emitting lasers (VCSEL), organic light emitting diodes (OLED), polymer light emitting diodes (PLED), light emitting polymers (LEP), liquid crystal displays (LCD), microelectromechanical systems (MEMS), or any other device configured to selectively transmit, reflect, and/or emit light to provide the plurality of emitted light beams 52. In some examples, the light sources 22 can be configured to emit the emitted light beams 52 in a wavelength range that can be detected by detectors 32 included in the receive block 30. The wavelength range could, for example, be in the ultraviolet, visible, and/or infrared portions of the electromagnetic spectrum. In some examples, the wavelength range can be a narrow wavelength range, such as provided by lasers. In one example, the wavelength range includes wavelengths that are approximately 905 nm. Additionally, the light sources 22 can be configured to emit the emitted light beams 52 in the form of pulses. In some examples, the plurality of light sources 22 can be disposed on one or more substrates (e.g., printed circuit boards (PCB), flexible PCBs, etc.) and arranged to emit the plurality of light beams 52 towards the exit aperture 26.

In some examples, the plurality of light sources 22 can be configured to emit uncollimated light beams included in the emitted light beams 52. For example, the emitted light beams 52 can diverge in one or more directions along the transmit path due to the uncollimated light beams emitted by the plurality of light sources 22. In some examples, vertical and horizontal extents of the emitted light beams 52 at any position along the transmit path can be based on an extent of the divergence of the uncollimated light beams emitted by the plurality of light sources 22.

The exit aperture 26 arranged along the transmit path of the emitted light beams 52 can be configured to accommodate the vertical and horizontal extents of the plurality of light beams 52 emitted by the plurality of light sources 22 at the exit aperture 26. It is noted that the block diagram shown in FIG. 1A is described in connection with functional modules for convenience in description. However, the functional modules in the block diagram of FIG. 1A can be physically implemented in other locations. For example, although illustrated that the exit aperture 26 is included in the transmit block 20, the exit aperture 26 can be physically included in both the transmit block 20 and the shared space 40. For example, the transmit block 20 and the shared space 40 can be separated by a wall that includes the exit aperture 26. In this case, the exit aperture 26 can correspond to a transparent portion of the wall. In one example, the transparent portion can be a hole or cut-away portion of the wall. In another example, the wall can be formed from a transparent substrate (e.g., glass) coated with a non-transparent material, and the exit aperture 26 can be a portion of the substrate that is not coated with the non-transparent material.

In some examples of the sensing system 10, it may be desirable to minimize size of the exit aperture 26 while accommodating the vertical and horizontal extents of the plurality of light beams 52. For example, minimizing the size of the exit aperture 26 can improve the optical shielding of the light sources 22 described above in the functions of the housing 12. Additionally or alternatively, the wall separating the transmit block 20 and the shared space 40 can be arranged along the receive path of the focused light 58, and thus, the exit aperture 26 can be minimized to allow a larger portion of the focused light 58 to reach the wall. For example, the wall can be coated with a reflective material (e.g., reflective surface 42 in shared space 40) and the receive path can include reflecting the focused light 58 by the reflective material towards the receive block 30. In this case, minimizing the size of the exit aperture 26 can allow a larger portion of the focused light 58 to reflect off the reflective material with which the wall is coated.

To minimize the size of the exit aperture 26, in some examples, the divergence of the emitted light beams 52 can be reduced by partially collimating the uncollimated light beams emitted by the light sources 22 to minimize the vertical and horizontal extents of the emitted light beams 52 and thus minimize the size of the exit aperture 26. For example, each light source of the plurality of light sources 22 can include a cylindrical lens arranged adjacent to the light source. The light source may emit a corresponding uncollimated light beam that diverges more in a first direction than in a second direction. The cylindrical lens may pre-collimate the uncollimated light beam in the first direction to provide a partially collimated light beam, thereby reducing the divergence in the first direction. In some examples, the partially collimated light beam diverges less in the first direction than in the second direction. Similarly, uncollimated light beams from other light sources of the plurality of light sources 22 can have a reduced beam width in the first direction and thus the emitted light beams 52 can have a smaller divergence due to the partially collimated light beams. In this example, at least one of the vertical and horizontal extents of the exit aperture 26 can be reduced due to partially collimating the light beams 52.

Additionally or alternatively, to minimize the size of the exit aperture 26, in some examples, the light sources 22 can be arranged along a shaped surface defined by the transmit block 20. In some examples, the shaped surface may be faceted and/or substantially curved. The faceted and/or curved surface can be configured such that the emitted light beams 52 converge towards the exit aperture 26, and thus the vertical and horizontal extents of the emitted light beams 52 at the exit aperture 26 can be reduced due to the arrangement of the light sources 22 along the faceted and/or curved surface of the transmit block 20.

In some examples, a curved surface of the transmit block 20 can include a curvature along the first direction of divergence of the emitted light beams 52 and a curvature along the second direction of divergence of the emitted light beams 52, such that the plurality of light beams 52 converge towards a central area in front of the plurality of light sources 22 along the transmit path.

To facilitate such curved arrangement of the light sources 22, in some examples, the light sources 22 can be disposed on a flexible substrate (e.g., flexible PCB) having a curvature along one or more directions. For example, the curved flexible substrate can be curved along the first direction of divergence of the emitted light beams 52 and the second direction of divergence of the emitted light beams 52. Additionally or alternatively, to facilitate such curved arrangement of the light sources 22, in some examples, the light sources 22 can be disposed on a curved edge of one or more vertically-oriented printed circuit boards (PCBs), such that the curved edge of the PCB substantially matches the curvature of the first direction (e.g., the vertical plane of the PCB). In this example, the one or more PCBs can be mounted in the transmit block 20 along a horizontal curvature that substantially matches the curvature of the second direction (e.g., the horizontal plane of the one or more PCBs). For example, the transmit block 20 can include four PCBs, with each PCB mounting sixteen light sources, so as to provide 64 light sources along the curved surface of the transmit block 20. In this example, the 64 light sources are arranged in a pattern such that the emitted light beams 52 converge towards the exit aperture 26 of the transmit block 20.

The transmit block 20 can optionally include the mirror 24 along the transmit path of the emitted light beams 52 between the light sources 22 and the exit aperture 26. By including the mirror 24 in the transmit block 20, the transmit path of the emitted light beams 52 can be folded to provide a smaller size of the transmit block 20 and the housing 12 of the sensing system 10 than a size of another transmit block where the transmit path that is not folded.

The receive block 30 includes a plurality of detectors 32 that can be configured to receive the focused light 58 via an entrance aperture 36. In some examples, each of the plurality of detectors 32 is configured and arranged to receive a portion of the focused light 58 corresponding to a light beam emitted by a corresponding light source of the plurality of light sources 22 and reflected of the one or more objects in the environment of the sensing system 10. The receive block 30 can optionally include the detectors 32 in a sealed environment having an inert gas 34.

The detectors 32 may comprise photodiodes, avalanche photodiodes, phototransistors, cameras, active pixel sensors (APS), charge coupled devices (CCD), cryogenic detectors, or any other sensor of light configured to receive focused light 58 having wavelengths in the wavelength range of the emitted light beams 52.

To facilitate receiving, by each of the detectors 32, the portion of the focused light 58 from the corresponding light source of the plurality of light sources 22, the detectors 32 can be disposed on one or more substrates and arranged accordingly. For example, the light sources 22 can be arranged along a curved surface of the transmit block 20. Detectors 32 can be arranged along a curved surface of the receive block 30. In some embodiments, the curved surface of the receive block 30 may include a similar or identical curved surface as that of transmit block 20. Thus, each of the detectors 32 may be configured to receive light that was originally emitted by a corresponding light source of the plurality of light sources 22.

To provide the curved surface of the receive block 30, the detectors 32 can be disposed on the one or more substrates similarly to the light sources 22 disposed in the transmit block 20. For example, the detectors 32 can be disposed on a flexible substrate (e.g., flexible PCB) and arranged along the curved surface of the flexible substrate to each receive focused light originating from a corresponding light source of the light sources 22. In this example, the flexible substrate may be held between two clamping pieces that have surfaces corresponding to the shape of the curved surface of the receive block 30. Thus, in this example, assembly of the receive block 30 can be simplified by sliding the flexible substrate onto the receive block 30 and using the two clamping pieces to hold it at the correct curvature.

The focused light 58 traversing along the receive path can be received by the detectors 32 via the entrance aperture 36. In some examples, the entrance aperture 36 can include a filtering window that passes light having wavelengths within the wavelength range emitted by the plurality of light sources 22 and attenuates light having other wavelengths. In this example, the detectors 32 receive the focused light 58 substantially comprising light having the wavelengths within the wavelength range.

In some examples, the plurality of detectors 32 included in the receive block 30 can include, for example, avalanche photodiodes in a sealed environment that is filled with the inert gas 34. The inert gas 34 may comprise, for example, nitrogen.

The shared space 40 includes the transmit path for the emitted light beams 52 from the transmit block 20 to the lens 50, and includes the receive path for the focused light 58 from the lens 50 to the receive block 30. In some examples, the transmit path at least partially overlaps with the receive path in the shared space 40. By including the transmit path and the receive path in the shared space 40, advantages with respect to size, cost, and/or complexity of assembly, manufacture, and/or maintenance of the sensing system 10 can be provided.

While the exit aperture 26 and the entrance aperture 36 are illustrated as being part of the transmit block 20 and the receive block 30, respectively, it is understood that such apertures may be arranged or placed at other locations. In some embodiments, the function and structure of the exit aperture 26 and the entrance aperture 36 may be combined. For example, the shared space 40 may include a shared entrance/exit aperture. It will be understood that other ways to arrange the optical components of system 10 within housing 12 are possible and contemplated.

In some examples, the shared space 40 can include a reflective surface 42. The reflective surface 42 can be arranged along the receive path and configured to reflect the focused light 58 towards the entrance aperture 36 and onto the detectors 32. The reflective surface 42 may comprise a prism, mirror or any other optical element configured to reflect the focused light 58 towards the entrance aperture 36 in the receive block 30. In some examples, a wall may separate the shared space 40 from the transmit block 20. In these examples, the wall may comprise a transparent substrate (e.g., glass) and the reflective surface 42 may comprise a reflective coating on the wall with an uncoated portion for the exit aperture 26.

In embodiments including the reflective surface 42, the reflective surface 42 can reduce size of the shared space 40 by folding the receive path similarly to the mirror 24 in the transmit block 20. Additionally or alternatively, in some examples, the reflective surface 42 can direct the focused light 58 to the receive block 30 further providing flexibility to the placement of the receive block 30 in the housing 12. For example, varying the tilt of the reflective surface 42 can cause the focused light 58 to be reflected to various portions of the interior space of the housing 12, and thus the receive block 30 can be placed in a corresponding position in the housing 12. Additionally or alternatively, in this example, the sensing system 10 can be calibrated by varying the tilt of the reflective surface 42.

The lens 50 mounted to the housing 12 can have an optical power to both collimate the emitted light beams 52 from the light sources 22 in the transmit block 20, and focus the reflected light 56 from the one or more objects in the environment of the sensing system 10 onto the detectors 32 in the receive block 30. In one example, the lens 50 has a focal length of approximately 120 mm. By using the same lens 50 to perform both of these functions, instead of a transmit lens for collimating and a receive lens for focusing, advantages with respect to size, cost, and/or complexity can be provided. In some examples, collimating the emitted light beams 52 to provide the collimated light beams 54 allows determining the distance travelled by the collimated light beams 54 to the one or more objects in the environment of the sensing system 10.

While, as described herein, lens 50 is utilized as a transmit lens and a receive lens, it will be understood that separate lens and/or other optical elements are contemplated within the scope of the present disclosure. For example, lens 50 could represent distinct lenses or lens sets along discrete optical transmit and receive paths.

In an example scenario, the emitted light beams 52 from the light sources 22 traversing along the transmit path can be collimated by the lens 50 to provide the collimated light beams 54 to the environment of the sensing system 10. The collimated light beams 54 may then reflect off the one or more objects in the environment of the sensing system 10 and return to the lens 50 as the reflected light 56. The lens 50 may then collect and focus the reflected light 56 as the focused light 58 onto the detectors 32 included in the receive block 30. In some examples, aspects of the one or more objects in the environment of the sensing system 10 can be determined by comparing the emitted light beams 52 with the focused light beams 58. The aspects can include, for example, distance, shape, color, and/or material of the one or more objects. Additionally, in some examples, by rotating the housing 12, a three-dimensional map of the surroundings of the sensing system 10 can be determined.

In some examples where the plurality of light sources 22 are arranged along a curved surface of the transmit block 20, the lens 50 can be configured to have a focal surface corresponding to the curved surface of the transmit block 20. For example, the lens 50 can include an aspheric surface outside the housing 12 and a toroidal surface inside the housing 12 facing the shared space 40. In this example, the shape of the lens 50 allows the lens 50 to both collimate the emitted light beams 52 and focus the reflected light 56. Additionally, in this example, the shape of the lens 50 allows the lens 50 to have the focal surface corresponding to the curved surface of the transmit block 20. In some examples, the focal surface provided by the lens 50 substantially matches the curved shape of the transmit block 20. Additionally, in some examples, the detectors 32 can be arranged similarly in the curved shape of the receive block 30 to receive the focused light 58 along the curved focal surface provided by the lens 50. Thus, in some examples, the curved surface of the receive block 30 may also substantially match the curved focal surface provided by the lens 50.

Figure 1B:
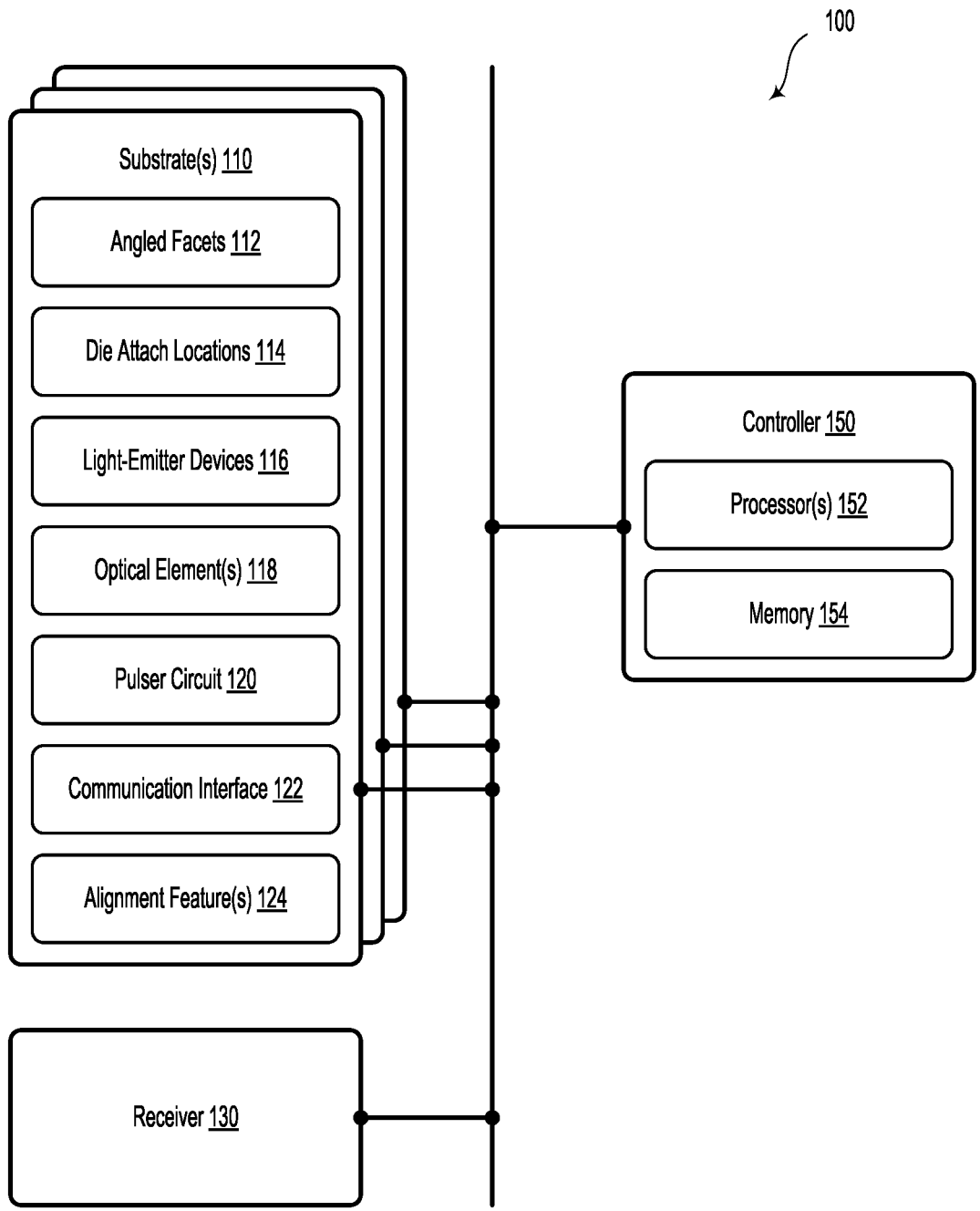
FIG. 1B illustrates a transmit block, according to an example embodiment.

FIG. 1B illustrates a transmit block 100, according to an example embodiment. Transmit block 100 may be similar or identical to transmit block 20 as illustrated and described with reference to FIG. 1A. Transmit block 100 may include a light-emitter portion of LIDAR system. In some embodiments, the transmit block 100 may be incorporated as part of a sensing system of an autonomous or semi-autonomous vehicle, such as vehicle 300 as illustrated and described in reference to FIGS. 3A and 3B.

In an example embodiment, transmit block 100 includes at least one substrate 110, a receiver 130, and a controller 150. The at least one substrate 110 includes a plurality of angled facets 112 along a front edge. In some embodiments, the at least one substrate 110 may include several flat circuit boards with the angled facets 112 arranged along an edge of the flat circuit boards.

The at least one substrate 110 also includes a die attach location 114 corresponding to each angled facet 112. The plurality of angled facets 112 provides a corresponding plurality of elevation angles. Namely, a set of angle differences between adjacent elevation angles includes at least two different angle difference values. In other words, the angled facets 112 are fabricated so that the corresponding elevation angles include a heterogeneous set of angle differences between adjacent elevation angles. For example, while one angle difference between a first pair of adjacent elevation angles is 0.18 degrees, another angle difference between a second pair of adjacent elevation angles could be 0.3 degrees. Other angle difference values are possible and contemplated herein. In some embodiments, some angle differences could be arbitrarily large (e.g., 5 degrees or more) and some angle differences may be as small as manufacturing tolerances can provide (e.g., so as to form slightly different angles of the angled facets 112 on the substrate 110).

The at least one substrate 110 includes a plurality of light-emitter devices 116. In various embodiments, the light-emitter devices 116 may include laser diodes, light-emitting diodes, or other types of light-emitting devices. In an example embodiment, the light-emitter devices 116 include InGaAs/GaAs laser diodes configured to emit light at a wavelength around 903 nanometers. Additionally or alternatively, the light emitter devices 116 may include one or more master oscillator power amplifier (MOPA) fiber lasers. Such fiber lasers may be configured to provide light pulses at or around 1550 nanometers and may include a seed laser and a length of active optical fiber configured to amplify the seed laser light to higher power levels. However, other types of light-emitting devices, materials, and emission wavelengths are possible and contemplated.

Respective light-emitter devices 116 are coupled to respective die attach locations 114 according to a respective elevation angle of the respective angled facet 112. The plurality of light-emitter devices 116 is configured to emit light into an environment along the plurality of elevation angles toward respective target locations so as to provide a desired resolution.

In some embodiments, the desired resolution could include a target resolution at a given distance away from the transmit block 100. For example, the desired resolution may include a resolution of 7.5 centimeters at 25 meters from the transmit block 100 and/or between adjacent target locations along a horizontal ground plane, whichever is closer. Other desired resolutions, both along a two-dimensional surface and within three-dimensional space, are possible and contemplated herein.

In some embodiments, the at least one substrate 110 may be disposed along a vertical plane. In such a scenario, the plurality of elevation angles may be defined with respect to a horizontal plane. As an example, one or more of the substrates 110 may be oriented vertically within a housing configured to spin about a vertical axis.

In such a scenario, at least one respective angle difference between adjacent elevation angles below the horizontal plane may be greater than respective angle differences between adjacent elevation angles above the horizontal plane.

As an example, transmit block 100 may include six substrates. Each substrate includes a respective plurality of angled facets that correspond to a respective portion of the plurality of elevation angles. In some embodiments, the plurality of elevation angles may include a non-overlapping set of angles by which light is emitted into the environment about transmit block 100.

In some embodiments, the six substrates may be coupled together and aligned according to a set of alignment features 124. The set of alignment features 124 may include a set of slots, grooves, or other physical features configured to reliably align the substrates 110 with respect to one another and/or the housing.

The plurality of light-emitter devices 116 may be distributed between each of the substrates 110. Each portion of the plurality of light-emitter devices 116 is configured to illuminate the environment at a respective pointing angle with respect to the vertical plane. As an example, the plurality of light-emitter devices 116 may include at least 64 light-emitter devices. However, a greater or fewer number of light-emitter devices 116 could be used.

In some embodiments, the at least one substrate 110 may also include, for each light-emitter device 116, a respective pulser circuit 120. Each respective pulser circuit 120 is configured to accept one or more signals, such as a power signal, an enable signal, and a trigger signal via a communication interface 122. The respective pulser circuits 120 are configured to provide light pulses between approximately 1-10 nanoseconds in duration. Other light pulse durations are possible.

In some embodiments, transmit block 100 may include optical elements 118, which could include respective lenses optically coupled to a respective output facet of the respective light-emitter devices 116. The respective lenses may include, but are not limited to, fast-axis collimating lenses.

The receiver 130 may include a device configured to receive at least a portion of the light emitted from the light-emitter devices 116 so as to correlate a received light pulse with an object in the environment of transmit block 100. The receiver 130 may include a plurality of light detection devices (e.g., InGaAs photodetectors). In some embodiments, the light detection devices may include single photon avalanche photodetectors (SPADs). Other types of photodetectors are possible and contemplated.

The controller 150 may include an on-board computer, an external computer, or a mobile computing platform, such as a smartphone, tablet device, personal computer, wearable device, etc. Additionally or alternatively, the controller 150 may include, or be connected to, a remotely-located computer system, such as a cloud server. In an example embodiment, the controller 150 may be configured to carry out some or all method blocks or steps described herein.

The controller 150 may include one or more processors 152 and at least one memory 154. The processor 152 may include, for instance, an application-specific integrated circuit (ASIC) or a field-programmable gate array (FPGA). Other types of processors, computers, or devices configured to carry out software instructions are contemplated herein. The memory 154 may include a non-transitory computer-readable medium, such as, but not limited to, read-only memory (ROM), programmable read-only memory (PROM), erasable programmable read-only memory (EPROM), electrically erasable programmable read-only memory (EEPROM), non-volatile random-access memory (e.g., flash memory), a solid state drive (SSD), a hard disk drive (HDD), a Compact Disc (CD), a Digital Video Disk (DVD), a digital tape, read/write (R/W) CDs, R/W DVDs, etc.

Figure 2A:
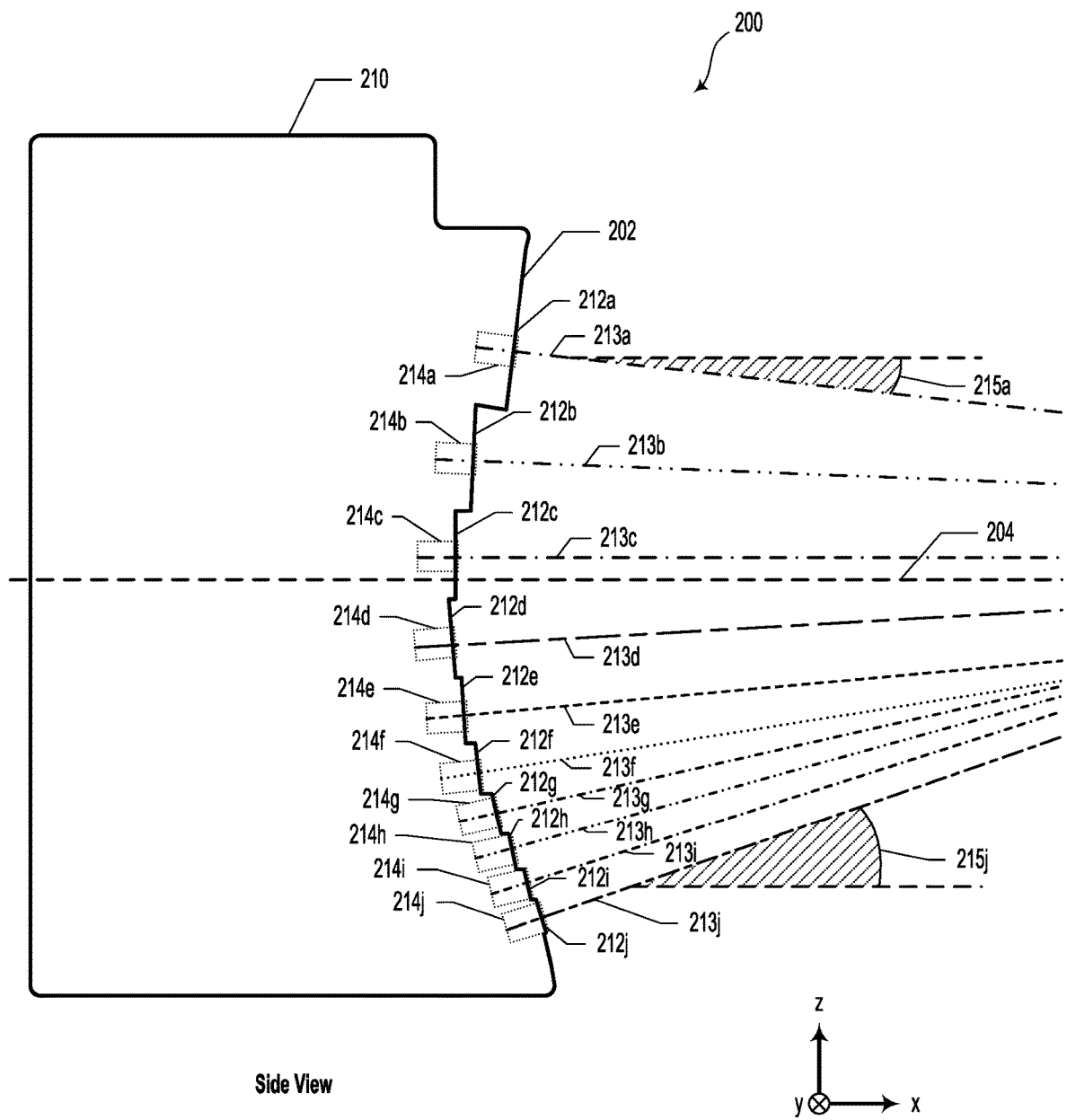
FIG. 2A illustrates a portion of a transmit block, according to an example embodiment.
Figure 2B:
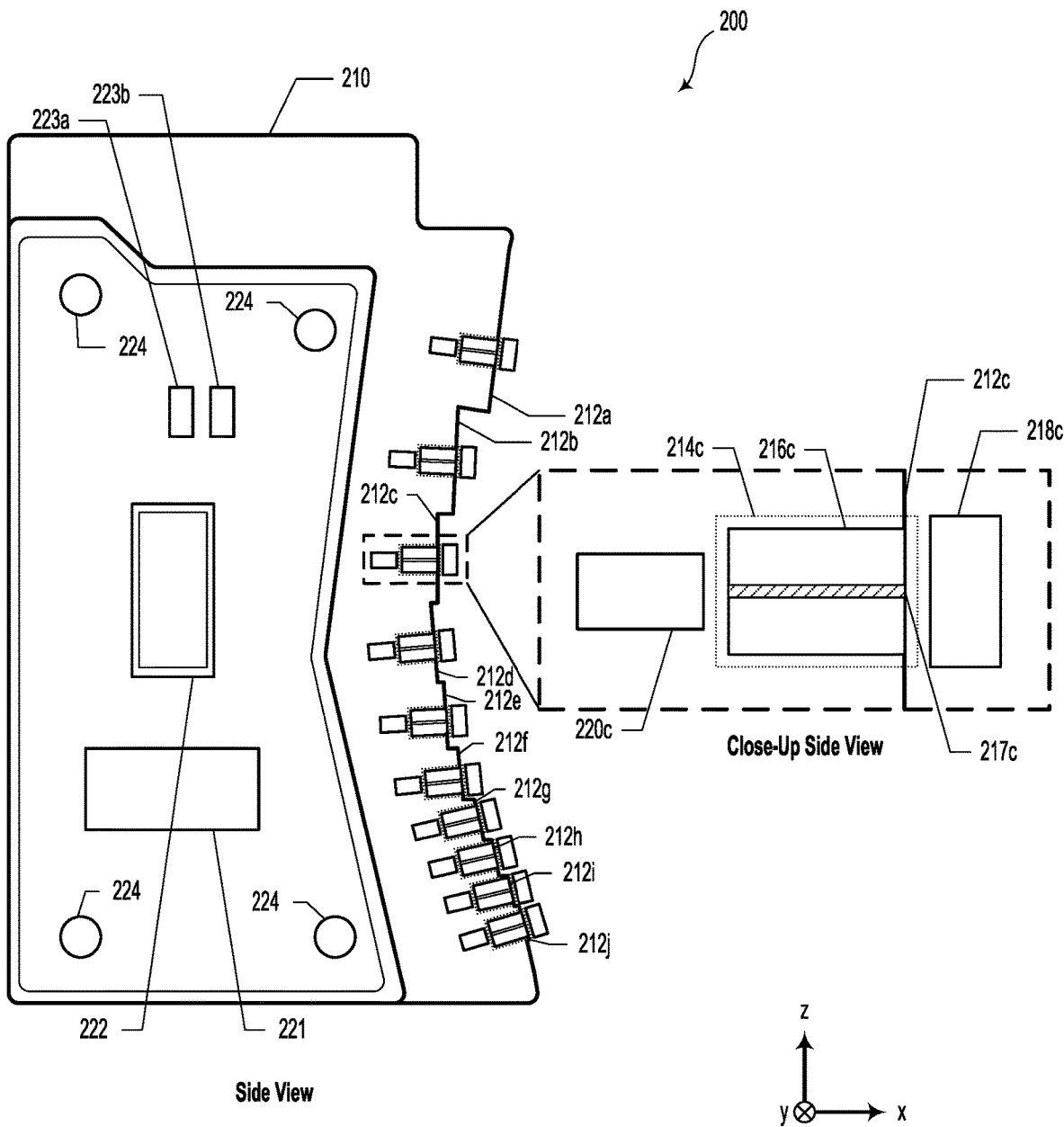
FIG. 2B illustrates a portion of a transmit block, according to an example embodiment.
Figure 2C:
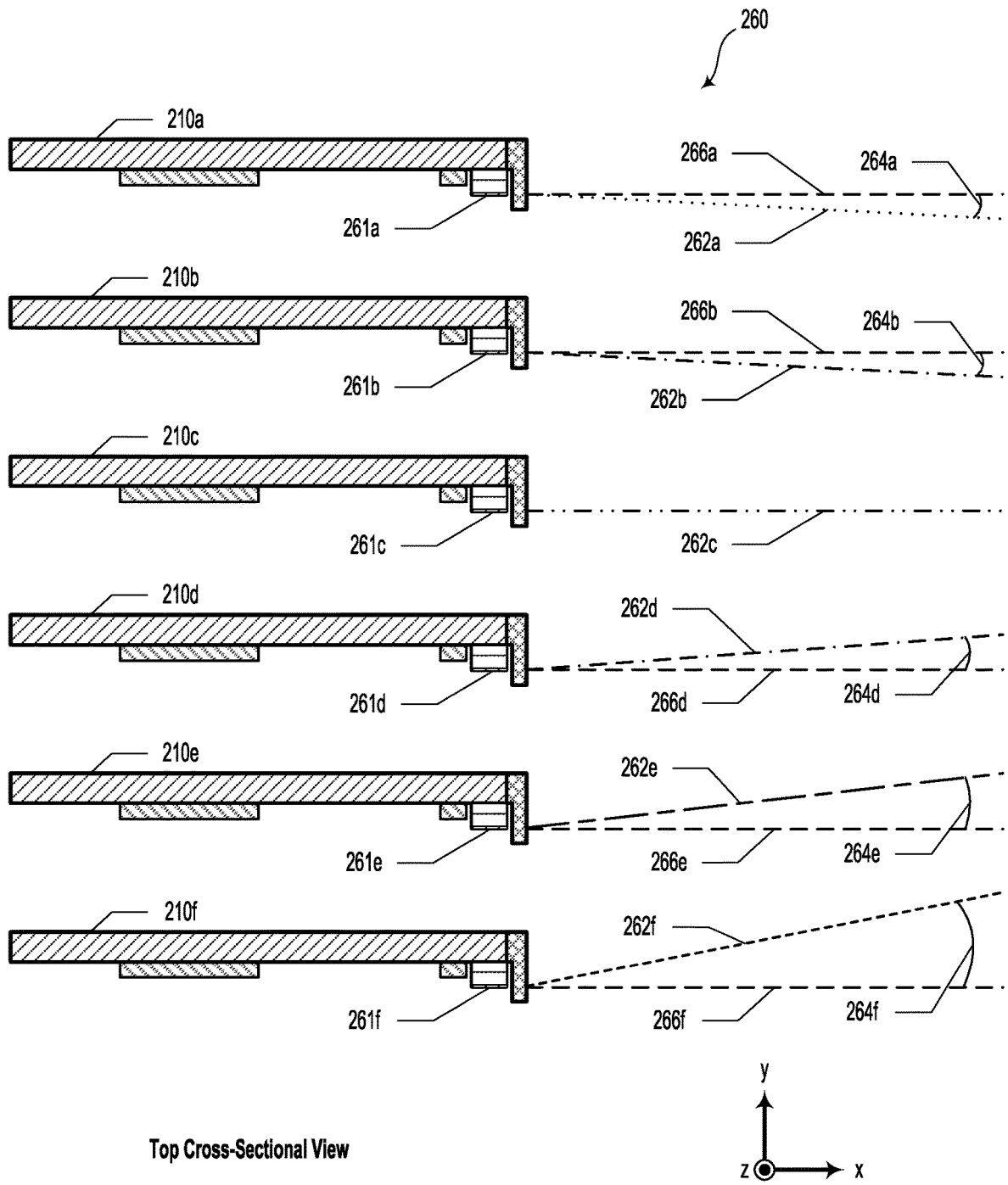
FIG. 2C illustrates a transmit block, according to an example embodiment.

FIGS. 2A-2C illustrate various views of transmit blocks 200 and 260. FIGS. 2A-2C may include elements that are similar or identical to transmit blocks 20 and 100 illustrated and described in reference to FIGS. 1A and 1B. FIG. 2A illustrates a portion of transmit block 200, according to an example embodiment. Transmit block 200 includes a substrate 210, which may include a printed circuit board or another type of rigid support member. The substrate 210 may be oriented along a vertical plane (e.g., the x-z plane), and/or along a plane that is perpendicular to a ground surface upon which a vehicle may travel.

At least one edge surface 202 of the substrate 210 may be formed, cut, or otherwise shaped to include a plurality of angled facets 212a-212j. The angled facets 212a-212j may be provided along the edge surface 202 of the substrate 210.

Each angled facet 212a-212j may provide a respective elevation angle 213a-213j with respect to a reference angle 204. The reference angle 204 could, for example, correspond to a horizontal plane (e.g., the x-y plane). Some angled facets may provide negative elevation angles, that is, elevation angles below the reference angle 204. For example, angled facet 212a may provide an elevation angle 215a that is declined with respect to the reference angle 204. Other angled facets may provide positive elevation angles or elevation angles above the reference angle 204. As an example, angled facet 212j may provide an elevation angle 215j that is inclined with respect to the reference angle 204.

As described elsewhere herein, at least one respective angle difference between adjacent elevation angles below the reference angle 204 (e.g., the angle difference between elevation angles 213a and 213b) is greater than respective angle differences between adjacent elevation angles above the reference angle 204 (e.g., the angle difference between elevation angles 213h and 213j). In other words, with the reference angle 204 corresponding to the horizontal plane, the angle difference between adjacent downward-pointing elevation angles may be larger than adjacent upward-pointing elevation angles.

As illustrated herein, the reference angle 204 may correspond with an x-axis, which may in turn be horizontal and/or parallel to an axis of motion of a vehicle. In some embodiments, the elevation angles 213a-213j may include a range of angles between approximately −18 degrees and +2.5 degrees with respect to the reference angle 204. However, other elevation angles (and ranges of angles) are possible and contemplated herein.

Although not illustrated herein, some embodiments may include the elevation angles 213a-213j as being based on a reference plane. The reference plane could be, for example, a horizontal plane (e.g., a plane parallel to the ground), a vertical plane (e.g., a plane perpendicular to the ground), or another plane defined by a direction of motion of the LIDAR system and/or motion of the vehicle to which the LIDAR system is attached.

As illustrated in FIG. 2A, a portion of the substrate 210 adjacent to each angled facet 212a-212j includes respective die attach locations 214a-214j.

FIG. 2B illustrates a portion of transmit block 200, according to an example embodiment. As illustrated in the close-up side view, a light emitter device (e.g., light emitter device 216c) may be coupled at each die attach location (e.g., die attach location 214c). Furthermore, the emitting surface 217c of the light emitter device 216c may be adjacent to, and/or aligned to, the angled facet 212c. In some embodiments, an optical element 218c may be positioned, coupled, and/or mounted adjacent to the emitting surface 217c of the light emitter device 216c. In an example embodiment, the optical element 218c may include a lens or another type of optical device configured to focus, steer, collimate, or otherwise interact with the light emitted from the emitting surface 217c of the light emitter device 216c.

In an example embodiment, transmit block 200 may include a plurality of pulser circuits (e.g., pulser circuit 220c). The pulser circuits may be configured to provide trigger pulses to the plurality of light emitter devices. Furthermore, while FIG. 2B illustrates a respective pulser circuit (e.g., 220c) for each light emitter device, it will be understood that a single centralized pulser circuit may be provided additionally or alternatively. Furthermore, instead of individual lens elements, it will be understood that a single lens could be used to affect the light emitted from the emitting surface of the light emitter devices. It will also be understood that the close-up side view illustrates elements of transmit block 200 that may be repeated or duplicated for each die attach location 214a-214j and/or angled facet 212a-212j.

Transmit block 200 includes a socket 221. The socket 221 may include an electrical coupling to a main controller and/or other substrates in transmit block 200. For example, the other substrates in transmit block 200 may include respective sets of light emitter devices, each of which may be oriented at a slightly different angle with respect to the horizontal plane.

Transmit block 200 includes a communication interface 222. The communication interface 222 may include one or more integrated circuits configured to provide wired or wireless connectivity to other components of transmit block 200.

Transmit block 200 also includes various electronic components 223a and 223b, which may include a power supply, processors, logic units, or other types of computer components.

Transmit block 200 includes alignment features 224. The alignment features 224 could include holes, slots, grooves, edges, or another type of physical structure configured to provide reliable fiducial alignment and/or registration between a plurality of substrates 210 in the system 200. In an example embodiment, one or more fiducial pins and/or standoffs may pass through holes in six respective substrates 210 of the transmit block 200 so as to align the substrates 210 with respect to one another.

FIG. 2C illustrates a top cross-sectional view of a transmit block 260, according to an example embodiment. Transmit block 260 includes six substrates 210a-210f. Each of the substrates 210a-210f include respective pluralities of light emitter devices 261a-f. Furthermore, in some embodiments, the light emitted from the respective pluralities of light emitter devices 216a-f may be oriented at respective pointing angles 264a-264f with regard to respective reference axes 266a-266f. That is, light emitter devices 261a on substrate 210a may be oriented to emit light at a first pointing angle 264a with respect to an axis parallel to the x-z plane (e.g., reference axis 266a). Light emitter devices 261b on substrate 210b may be oriented to emit light at a second pointing angle 264b with respect to an axis parallel to the x-z plane (e.g., reference axis 266b), and so on for the other substrates 210c-210f. In some embodiments, the pointing angle for each substrate and/or individual light emitter device may be provided by adjusting a position of an optical element (e.g., optical element 218c) with respect to the emitting surface of the respective light emitter device. In other embodiments, the pointing angle may be provided by physically arranging the respective substrates so that they are not parallel with respect to one another. In some embodiments, pointing angles could range from approximately −5 degrees to +5 degrees. However other pointing angle ranges are possible and contemplated in the present disclosure.

Figure 2D:
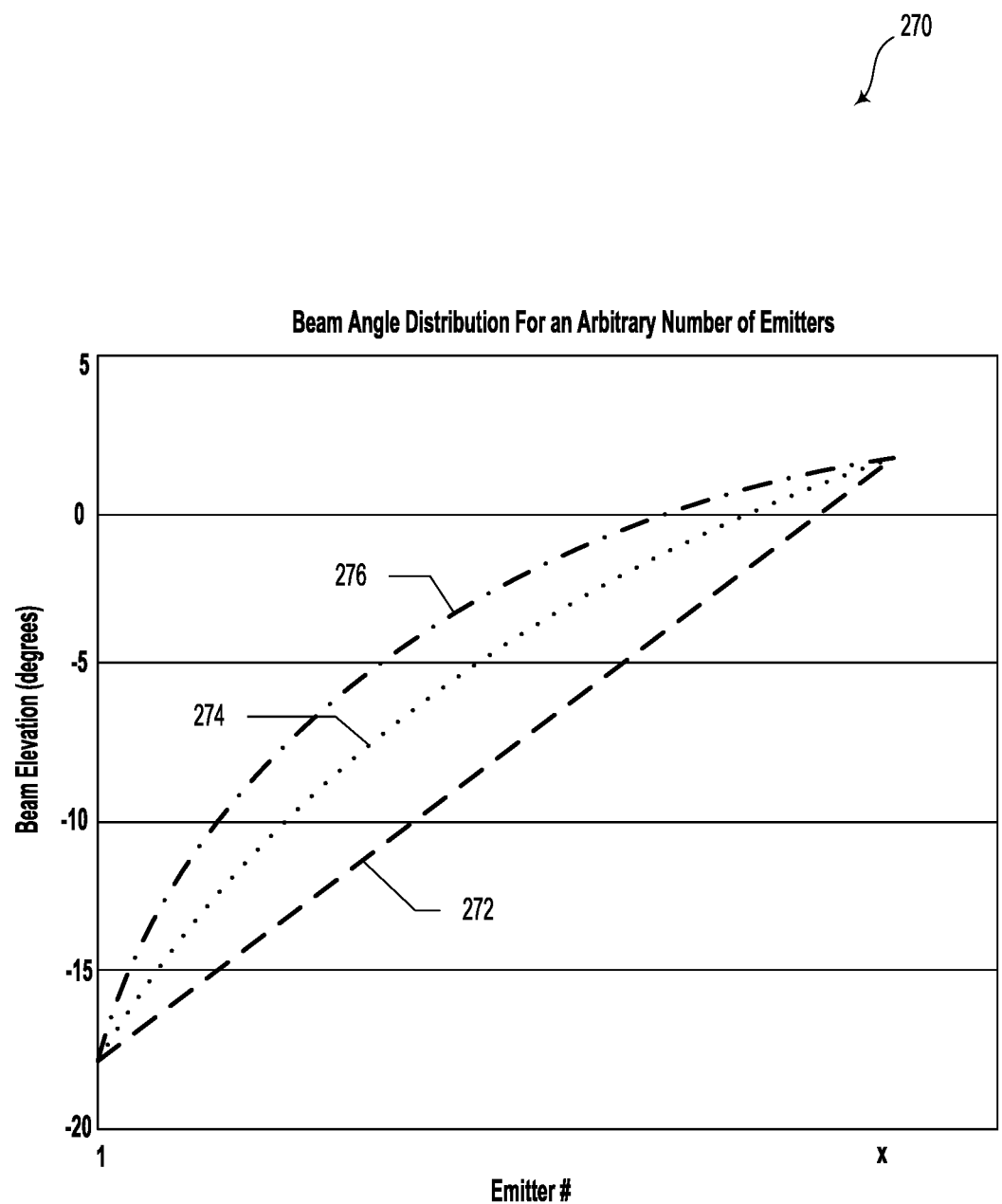
FIG. 2D illustrates several possible beam angle distributions, according to an example embodiment.

FIG. 2D illustrates several possible beam angle distributions 270 for an arbitrary number of light emitter devices, according to an example embodiment. For example, beam angle distributions 274 and 276 represent non-uniform angle distributions over a set of beam angles between roughly −18 degrees and +2 degrees. In such distributions, based on the non-linear shape of the beam angle distributions 274 and 276, fewer emitters and their respective beam angles are pointed downward (negative beam elevation angles) in comparison to the uniform, linear beam angle distribution 272. While two different non-uniform beam angle distributions are illustrated, it will be understood that other distributions are possible and contemplated herein. For example, non-linear beam angle distributions between roughly −10 degrees to +10 degrees are also considered herein.

Figure 2E:
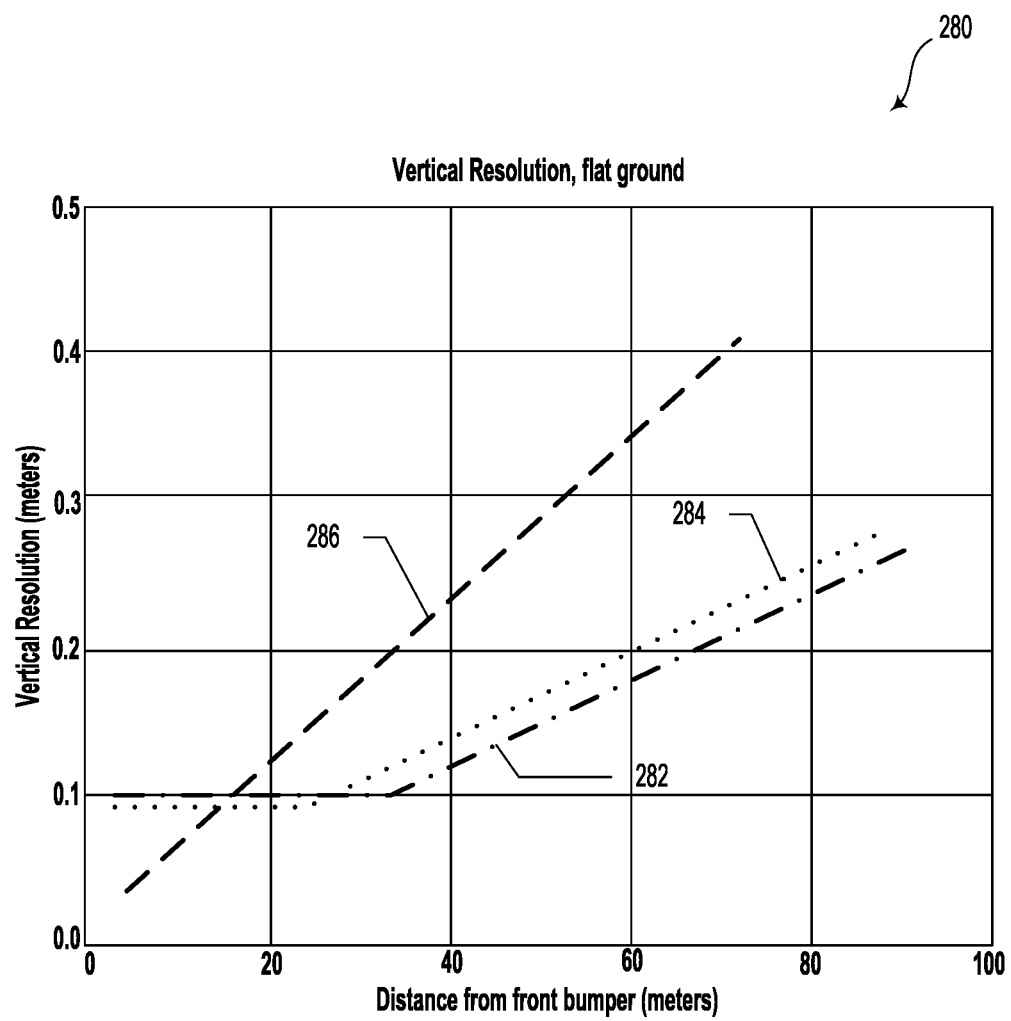
FIG. 2E illustrates several possible vertical resolution plots, according to an example embodiment.

FIG. 2E illustrates several possible vertical resolution plots 280, according to an example embodiment. The respective vertical resolution plots 282, 284, and 286 illustrate different design resolutions at various distances from a front portion of a vehicle (e.g., the front bumper of vehicle 300 as illustrated and described with regard to FIGS. 3A and 3B). Such design resolutions may serve as a basis for a desired beam angle distribution, such as those illustrated and described in FIG. 2D.

In an example embodiment, a linearly-increasing vertical resolution with respect to the distance from the front bumper (e.g., vertical resolution plot 286) may be provided by a plurality of light-emitter devices with a uniform beam angle distribution. In an example embodiment, vertical resolution plot 286 illustrates a vertical resolution that increases linearly with distance from a resolution of 0.03 meters at the front bumper to an approximate resolution of 0.42 meters at a distance of 75 meters from the front bumper.

In contrast, a non-linear vertical resolution may be provided by a plurality of light-emitter devices arranged with a non-uniform beam angle distribution, such as those described herein. Specifically, vertical resolution plot 284 includes a vertical resolution of approximately 0.09 meters (measured between adjacent light beams) from the front bumper out to 25 meters, at which point the vertical resolution may increase linearly with distance to a maximum spacing of approximately 0.28 meters between adjacent beams at 90 meters from the front bumper. As a further example, vertical resolution plot 282 includes a vertical resolution of approximately 0.1 meters from the front bumper out to 30 meters, at which point the vertical resolution may increase linearly with distance to a maximum of approximately 0.26 meters between adjacent beams at 90 meters from the front bumper. It will be understood that other non-linear vertical resolutions are possible and contemplated herein.

Figure 3A:
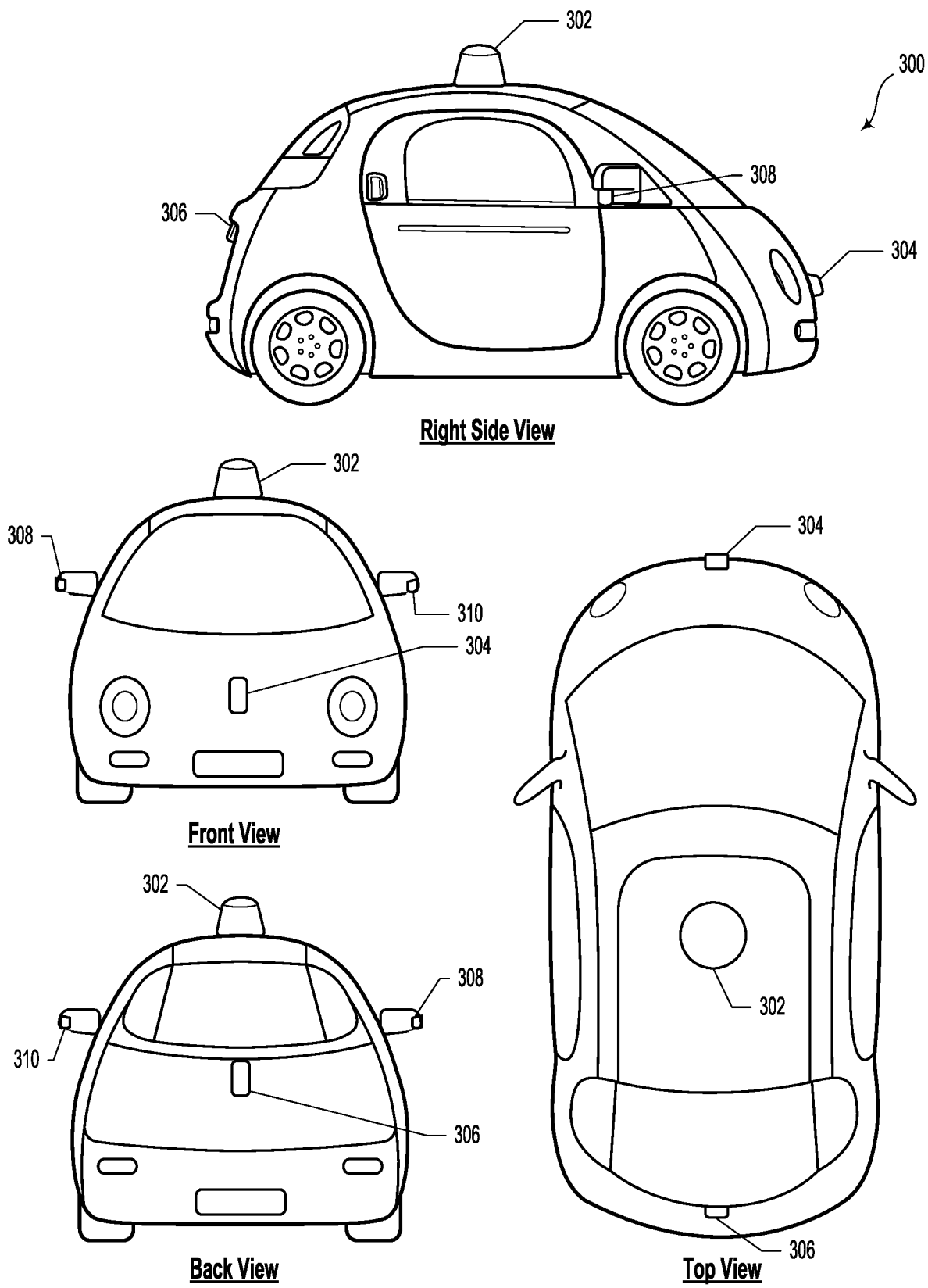
FIG. 3A illustrates a vehicle, according to an example embodiment.

FIG. 3A illustrates a vehicle 300, according to an example embodiment. The vehicle 300 may include one or more sensor systems 302, 304, 306, 308, and 310. The one or more sensor systems 302, 304, 306, 308, and 310 could be similar or identical to sensor system 10. As an example, sensor systems 302, 304, 306, 308, and 310 may include transmit blocks 20, 200, and 260 as illustrated and described with reference to FIGS. 1A, 2A, 2B, and 2C. Namely, sensor systems 302, 304, 306, 308, and 310 could include LIDAR sensors having a plurality of light-emitter devices arranged over a range of angles with respect to a given plane (e.g., the x-y plane). One or more of the sensor systems 302, 304, 306, 308, and 310 may be configured to rotate about an axis (e.g., the z-axis) perpendicular to the given plane so as to illuminate an environment around the vehicle 300 with light pulses. Based on detecting various aspects of reflected light pulses (e.g., the elapsed time of flight, polarization, etc.,), information about the environment may be determined.

In an example embodiment, sensor systems 302, 304, 306, 308, and 310 may be configured to provide respective point cloud information that may relate to physical objects within the environment of the vehicle 300.

Figure 3B:
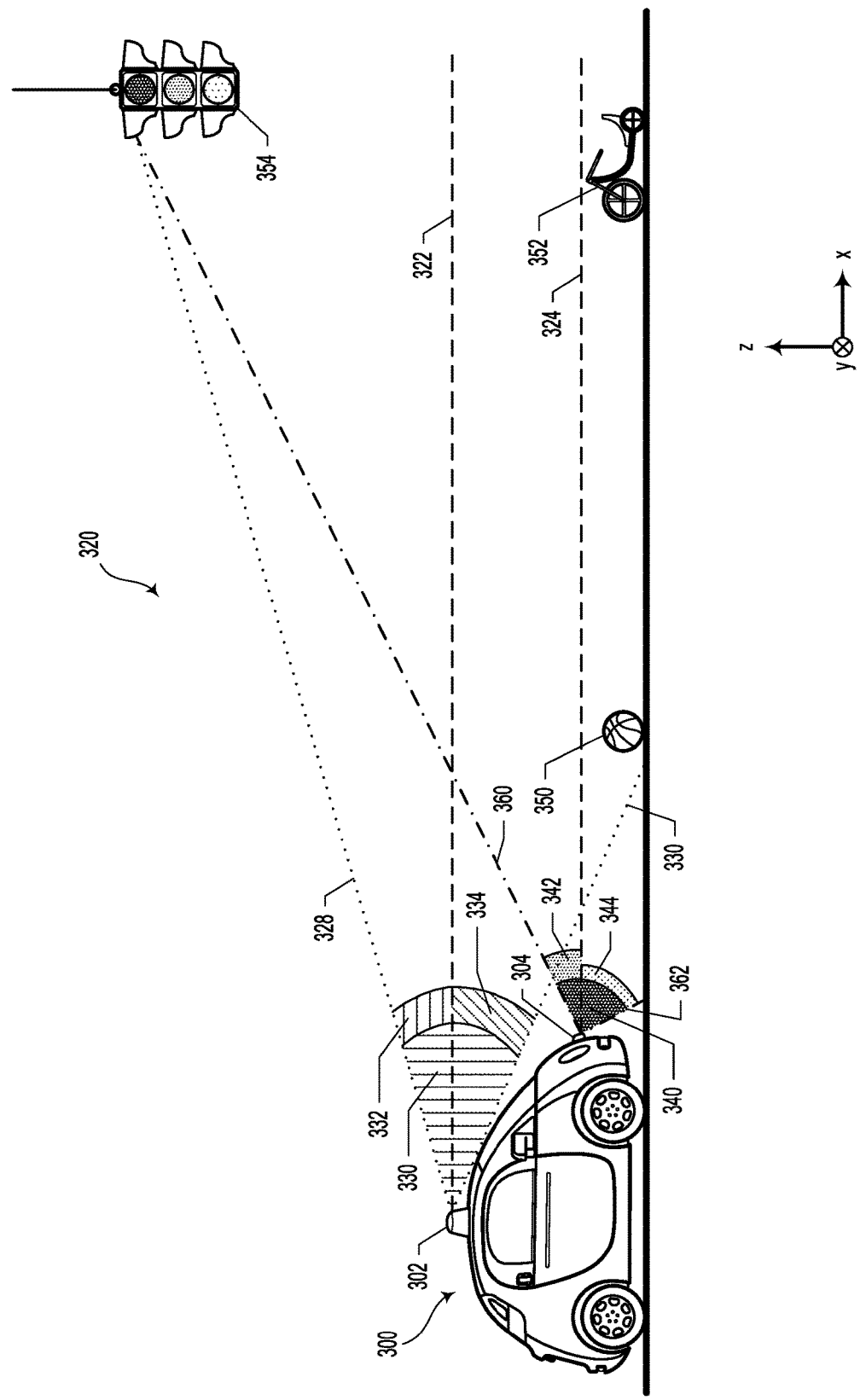
FIG. 3B illustrates a vehicle in a sensing scenario, according to an example embodiment.

FIG. 3B illustrates a vehicle 300 in a sensing scenario 320, according to an example embodiment. In such a scenario, sensor system 302 may be configured to emit light pulses into an environment of the vehicle 300 over an angle range 330 between a maximum angle 328 and a minimum angle 330. The angle range 330 may include a downward-pointing range 334 (e.g., angles below a horizontal plane 322) and an upward-pointing range 332 (e.g., angles above the horizontal plane 322). In some embodiments, a plurality of light-emitter devices of sensor system 302 may be are arranged in a non-linear angle distribution over the downward-pointing angle range 334. That is, to achieve a desired vertical beam resolution, the plurality of light-emitter devices of sensor system 302 may be arranged over beam elevations that include heterogeneous elevation angle differences between adjacent beams similar to those illustrated and described with regards to FIGS. 2D and 2E.

As a further example, sensor system 304 may be configured to emit light pulses into an environment of the vehicle 300 over an angle range 340, which may be defined between a maximum angle 360 and a minimum angle 362. The angle range 340 may include a downward-pointing range 344 (e.g., angles below a horizontal plane 324) and an upward-pointing range 342 (e.g., angles above the horizontal plane 324). In some embodiments, a plurality of light-emitter devices of sensor system 304 may illuminate the environment about the vehicle 300 with a non-linear angle distribution. That is, to achieve a desired vertical beam resolution, the plurality of light-emitter devices of sensor system 304 may be arranged over a set of beam elevations that include heterogeneous differences in elevation angle between adjacent beams similar to those illustrated and described with regards to FIGS. 2D and 2E.

By arranging the light-emitter devices of the respective sensor systems 302 and 304, a more uniform vertical beam resolution may be provided. Such vertical beam scanning resolutions may allow more reliable and/or more accurate sensing of various objects 350 and 352 as well as traffic signals 354 in the environment of the vehicle 300.

While systems 10, 100, 200, 260, and sensor systems 302, 304, 306, 308, and 310 and 320 are illustrated as including certain features, it will be understood that other types of systems are contemplated within the scope of the present disclosure.

As an example, an example embodiment may include a system having a plurality of light-emitter devices. The system may include a transmit block of a LIDAR device. For example, the system may be, or may be part of, a LIDAR device of a vehicle (e.g., a car, a truck, a motorcycle, a golf cart, an aerial vehicle, a boat, etc.). Each light-emitter device of the plurality of light-emitter devices is configured to emit light pulses along a respective beam elevation angle. The respective beam elevation angles could be based on a reference angle or reference plane, as described elsewhere herein. In some embodiments, the reference plane is based on an axis of motion of the vehicle.

The plurality of light-emitter devices in this example embodiment are arranged such that a combination of the respective beam elevation angles includes a non-uniform beam elevation angle distribution. That is, the respective angle differences between adjacent light-emitter devices may vary from neighbor-to-neighbor. In an example embodiment, at least one angle difference between respective beam elevation angles of two adjacent light-emitter devices having elevation angles below a reference plane is larger than at least one angle difference between respective beam elevation angles of two adjacent light-emitter devices having elevation angles above the reference plane. In other words, the angle difference between two adjacent downward-pointing light-emitter devices may be larger than the angle difference between two adjacent upward-pointing light-emitter devices.

Optionally, in some embodiments, less than 50% of the plurality of light-emitter devices are associated with beam elevation angles below the reference plane.

Additionally or alternatively, at least one light-emitter device with a respective elevation angle below the reference plane is configured to emit light pulses with a different shot schedule than at least one light-emitter device with a respective elevation angle above the reference plane.

In some embodiments, at least one light-emitter device with a respective elevation angle above the reference plane may be configured to emit light pulses with a lower duty cycle than at least one light-emitter device with a respective elevation angle below the reference plane.

In yet further embodiments, at least one light-emitter device with a respective elevation angle below the reference plane is configured to emit light pulses with a lower duty cycle than at least one light-emitter device with a respective elevation angle above the reference plane.

In some cases, at least one light-emitter device with a respective elevation angle below the reference plane is configured to emit light pulses with a lower power output per pulse than at least one light-emitter device with a respective elevation angle above the reference plane.

While certain description and illustrations herein describe systems with multiple light-emitter devices, LIDAR systems with few light-emitter devices (e.g., a single light-emitter device) are also contemplated herein. For example, light pulses emitted by a laser diode may be scanned about an environment of the system. The angle of emission of the light pulses may be adjusted by a scanning device such as, for instance, a mechanical scanning mirror and/or a rotational motor. For example, the scanning devices could rotate in a reciprocating motion about a given axis and/or rotate about a vertical axis. In another embodiment, the light-emitter device may emit light pulses towards a spinning prism mirror, which may cause the light pulses to be emitted into the environment based on an angle of the prism mirror angle when interacting with each light pulse. Additionally or alternatively, scanning optics and/or other types of electro-opto-mechanical devices are possible to scan the light pulses about the environment.

In some embodiments, a single light-emitter device may emit light pulses according to a variable shot schedule and/or with variable power per shot, as described herein. That is, emission power and/or timing of each laser pulse or shot may be based on a respective elevation angle of the shot. Furthermore, the variable shot schedule could be based on providing a desired vertical spacing at a given distance from the LIDAR system or from a surface (e.g., a front bumper) of a given vehicle supporting the LIDAR system. As an example, when the light pulses from the light-emitter device are directed downwards, the power-per-shot could be decreased due to a shorter anticipated maximum distance to target. Conversely, light pulses emitted by the light-emitter device at an elevation angle above a reference plane may have a relatively higher power-per-shot so as to provide sufficient signal-to-noise to adequately detect pulses that travel longer distances.

Furthermore, the shot schedule could be adjusted to reduce the wait time until a subsequent shot for a light pulse that is directed downwards. That is, due to a shorter distance traveled, the listening window may not be as long in duration as that for light pulses that travel farther within a given environment.

III. Example Methods

FIGS. 4A-4E illustrate various portion of a transmit block formed as a method 500 (illustrated in FIG. 5) for manufacturing an optical system 400 is carried out. FIGS. 4A-4E and 5 may include elements that are similar or identical to those illustrated and described with reference to FIGS. 1A, 1B, 2A, 2B, 2C, 3A, and/or 3B. It will be understood that the method of manufacturing 500 may include fewer or more steps or blocks of method 500 than those expressly disclosed herein. Furthermore, respective steps or blocks of method 500 may be performed in any order and each step or block may be performed one or more times. In some embodiments, method 500 may be combined with one or more of methods 600, 700, 800, or 900.

Block 502 of method 500 includes providing at least one substrate. The at least one substrate includes a plurality of angled facets along a front edge and a die attach location corresponding to each angled facet. The plurality of angled facets provides a corresponding plurality of elevation angles. In such a scenario, a set of angle differences between adjacent elevation angles includes at least two different angle difference values.

Figure 4A:
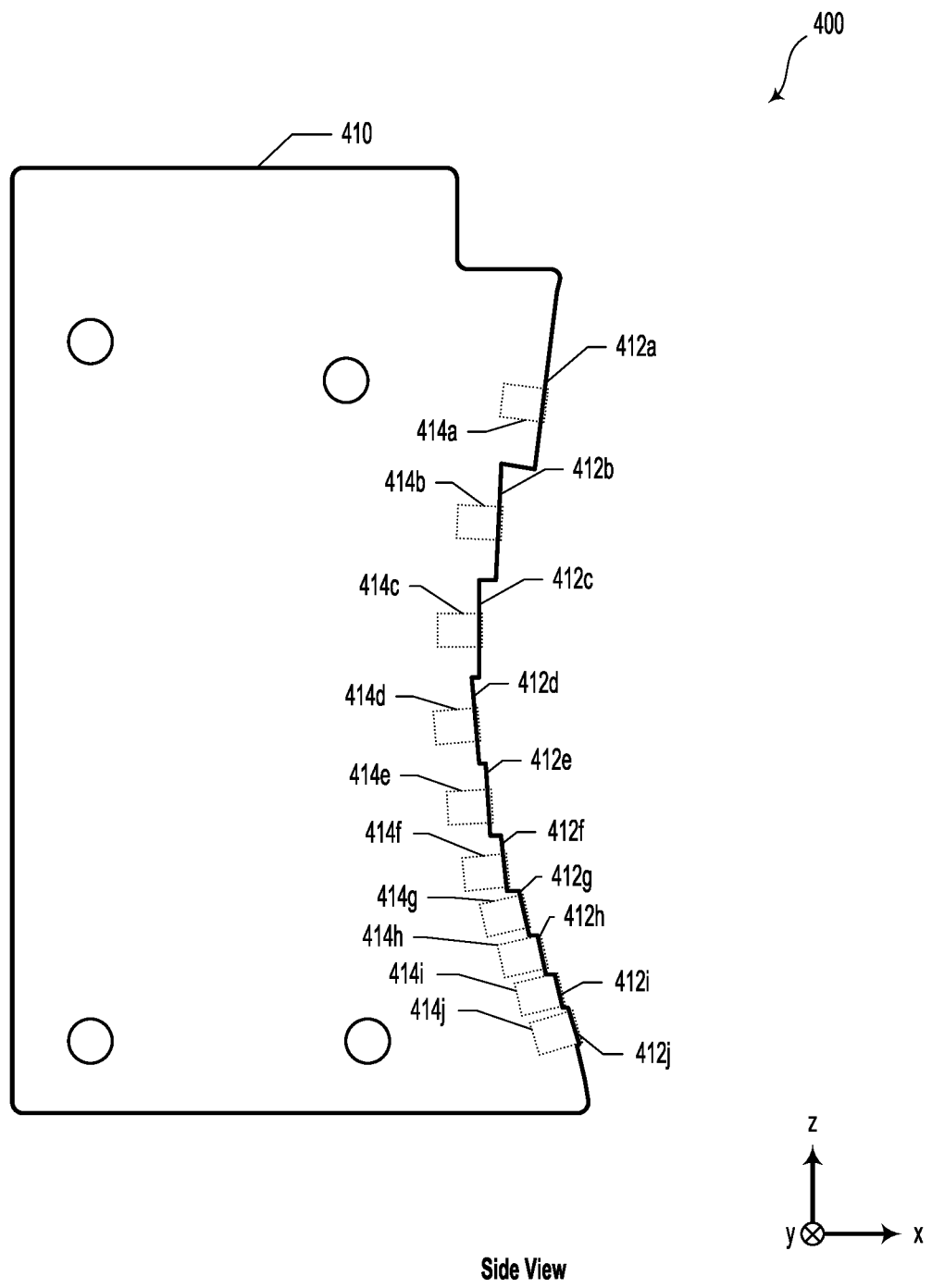
FIG. 4A illustrates a portion of a transmit block, according to an example embodiment.

FIG. 4A illustrates a portion of a transmit block 400 that includes a substrate 410. Substrate 410 may be formed from a printed circuit board material. In some embodiments, the substrate 410 may be formed by laser cutting and precision drilling operations. The substrate 410 may include a wire bondable finish, such as Electroless Nickel-Electroless Palladium-Immersion Gold (ENEPIG). The at least one substrate 410 includes a plurality of angled facets 412a-412j along a front edge and a die attach location (e.g., die attach locations 414a-414j) corresponding to each angled facet 412a-412j. In such a scenario, the plurality of angled facets 412a-412j provides a corresponding plurality of elevation angles. In an example embodiment, a set of angle differences between adjacent elevation angles may include at least two different angle difference values. That is, the elevation angles do not include a uniform angle difference, but rather the angle differences may differ from one another based on, for example, the respective elevation angles and whether the elevation angles are oriented below or above a horizontal plane. Generally, elevation angles oriented below the horizontal may be more widely spaced for at least the reason that the photons are unlikely to travel as far as those at higher elevation angles. As such, to achieve a given resolution of an environment around the optical system 400, fewer downward-pointing light beams can be provided in comparison to those with forward- or upward-pointing light beams.

Block 504 of method 500 includes attaching a plurality of light-emitter devices to respective die attach locations. In such a scenario, the attaching is performed according to a respective elevation angle of the respective angled facet.

Figure 4B:
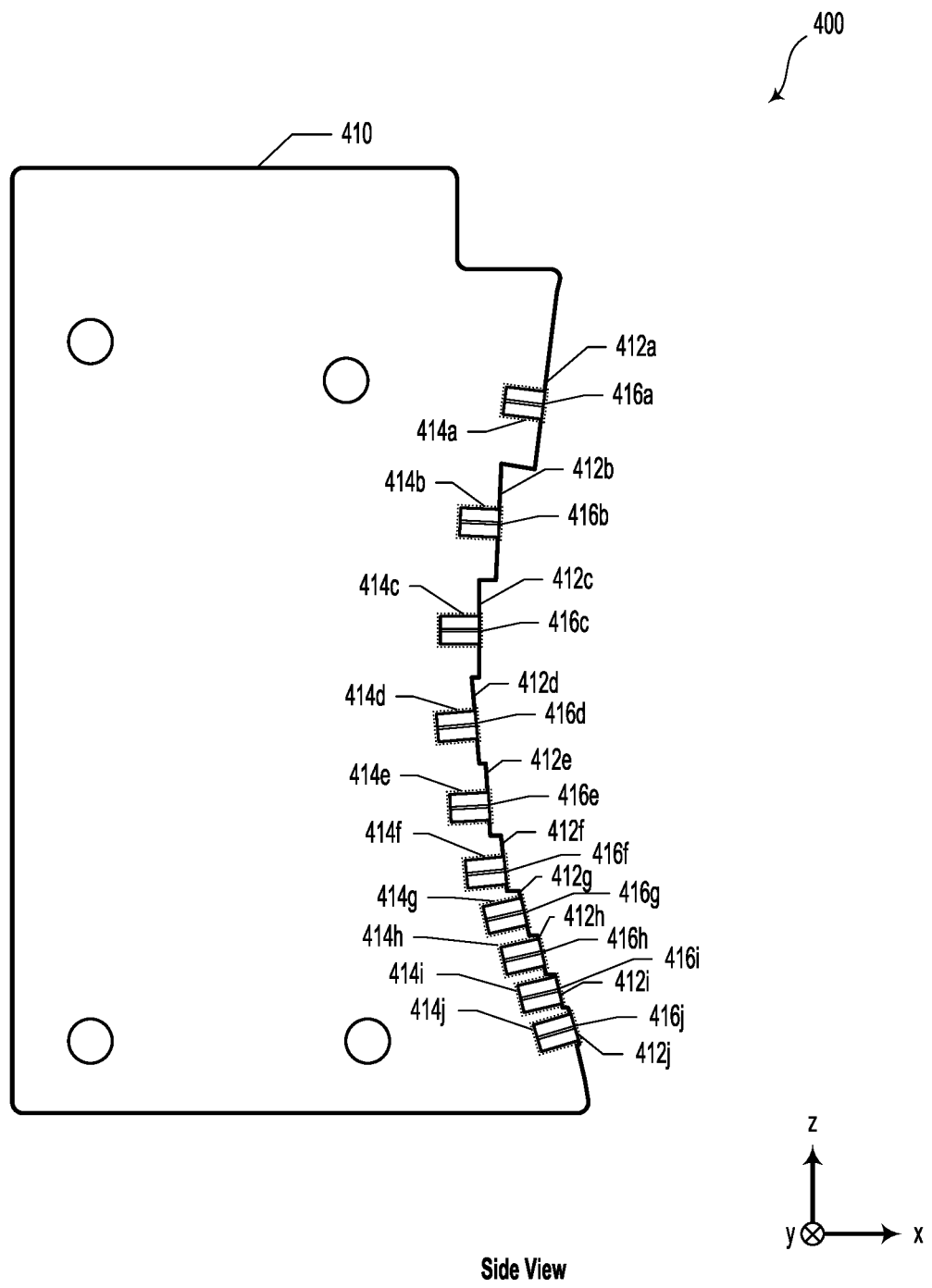
FIG. 4B illustrates a portion of a transmit block, according to an example embodiment.

FIG. 4B illustrates a portion of a transmit block 400 following attachment of a plurality of light-emitter devices 416a-416j to respective die attach locations 414a-414j. In such a scenario, the attaching may be performed according to a respective elevation angle of the respective angled facet 412a-412j.

Block 506 of method 500 includes electrically connecting each respective light-emitter device of the plurality of light-emitter devices to a respective pulser circuit.

Figure 4C:
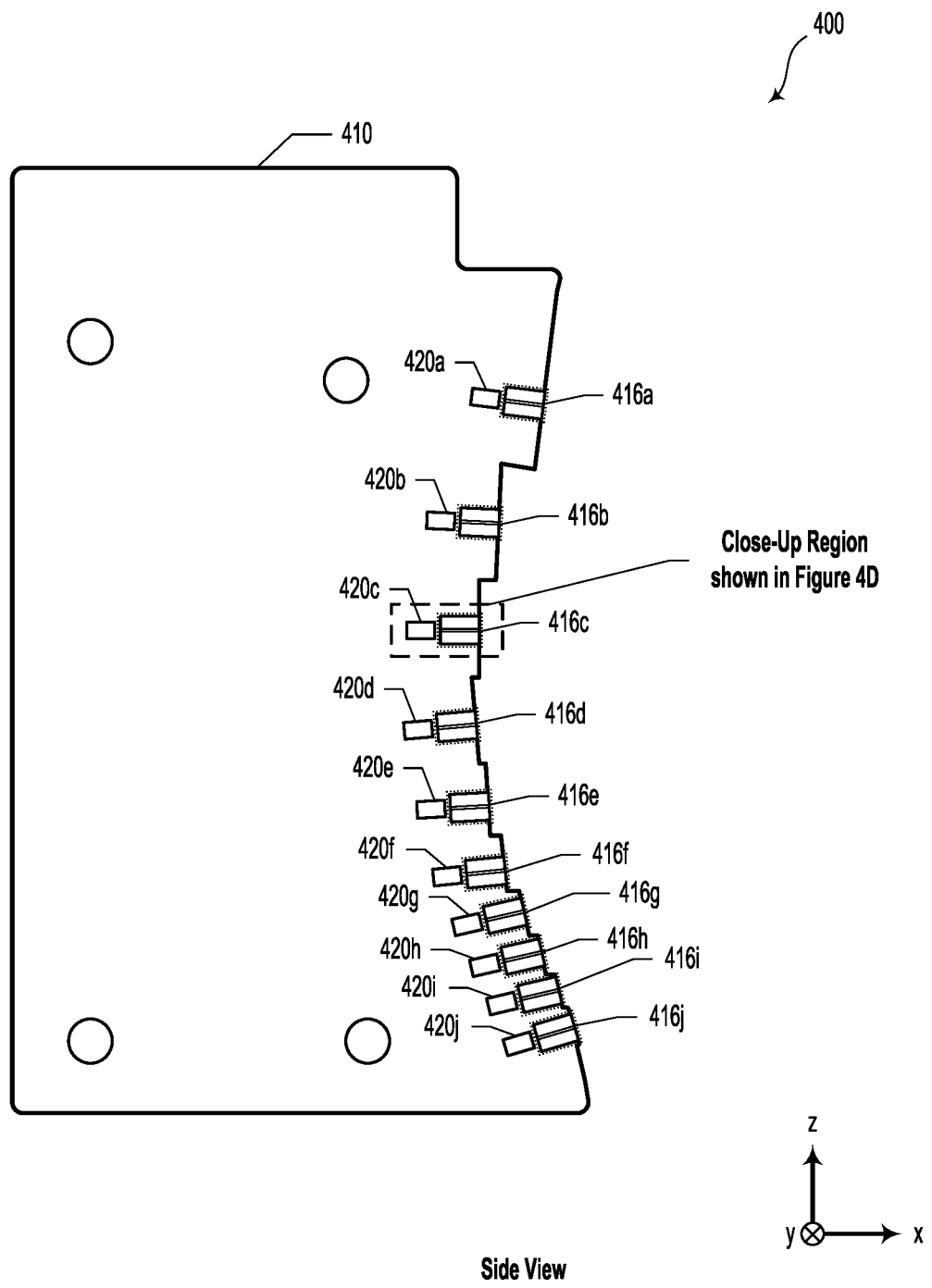
FIG. 4C illustrates a portion of a transmit block, according to an example embodiment.
Figure 4D:
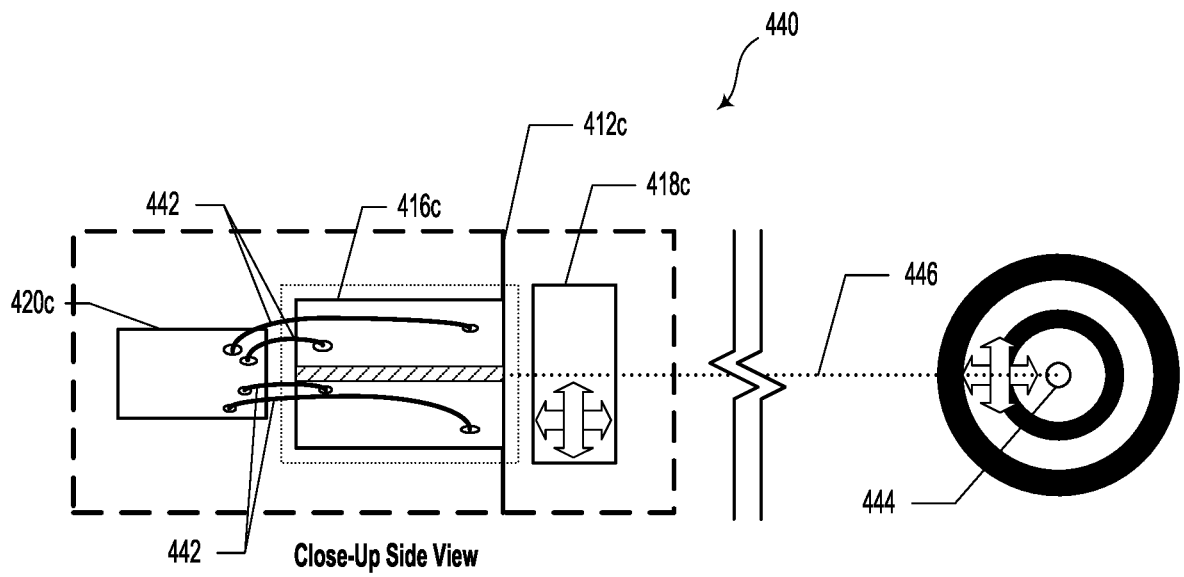
FIG. 4D illustrates a close up side view of a portion of a transmit block, according to an example embodiment.
Figure 4D:
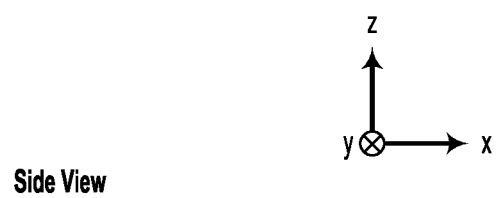

FIGS. 4C and 4D illustrate a portion of the transmit block 400 after electrically-connecting respective light-emitter devices 416a-416j to respective pulser circuits 420a-420j. For example, as illustrated in FIG. 4D, wire bonds 442 may be used to electrically connect the light-emitter device 416c to the pulser circuit 420c. In such scenarios, electrically-connecting the respective light-emitter devices to the respective pulser circuits may include providing a plurality of wire bonds (e.g., four 25 micron diameter wire bonds) between the respective light-emitter device and the respective pulser circuit. Other ways to electrically connect the light-emitter device 416c to the pulser circuit 420c are contemplated. For example, such electrical connections could be fabricated as part of an integrated pulser circuit that is hybridized (e.g., via indium bump bonds, wafer bonding, or other flip-chip methods) to the light-emitter device.

Block 508 includes optically aligning, such as by coupling each respective light-emitter device of the plurality of light-emitter devices to a respective lens.

As illustrated in the close-up side view 440, a lens 418c may be coupled to a light-emitter device 416c. In such a scenario, the lens 418c may be aligned with the light-emitter device 416c so that light 446 emitted from the light-emitter device 416c impinges on, or otherwise interacts with, a desired target location 444. As an example, aligning the respective lenses to the respective light-emitter devices (e.g., light-emitter device 416c) may include an active optical feedback control process. The active optical feedback control process may include causing the respective light-emitter device 416c to emit light 446 and then adjusting a position of the respective lens 418c such that a target location 444 is illuminated by the emitted light 446.

In some embodiments, method 500 may include attaching the respective lenses to their respective light-emitter devices. That is, in reference to FIG. 4D, once aligned, the lens 418c may be fixed (e.g., by gluing, clamping, or another attachment method) in place with respect to the light-emitter device 416c. In an example embodiment, attaching the plurality of light-emitting devices could be performed with a conductive, thermally-cured adhesive.

Figure 4E:
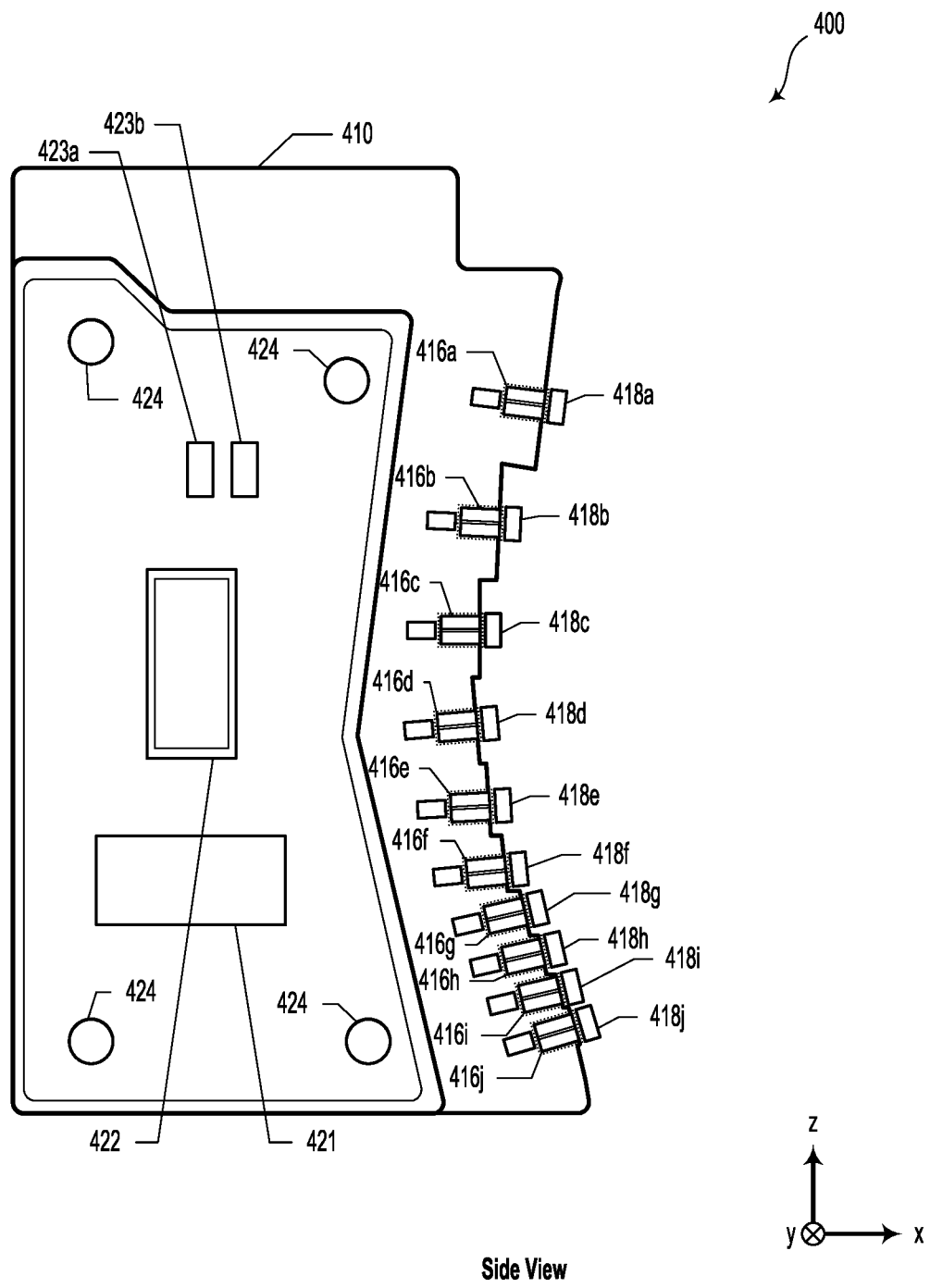
FIG. 4E illustrates a portion of a transmit block, according to an example embodiment.
Figure 5:
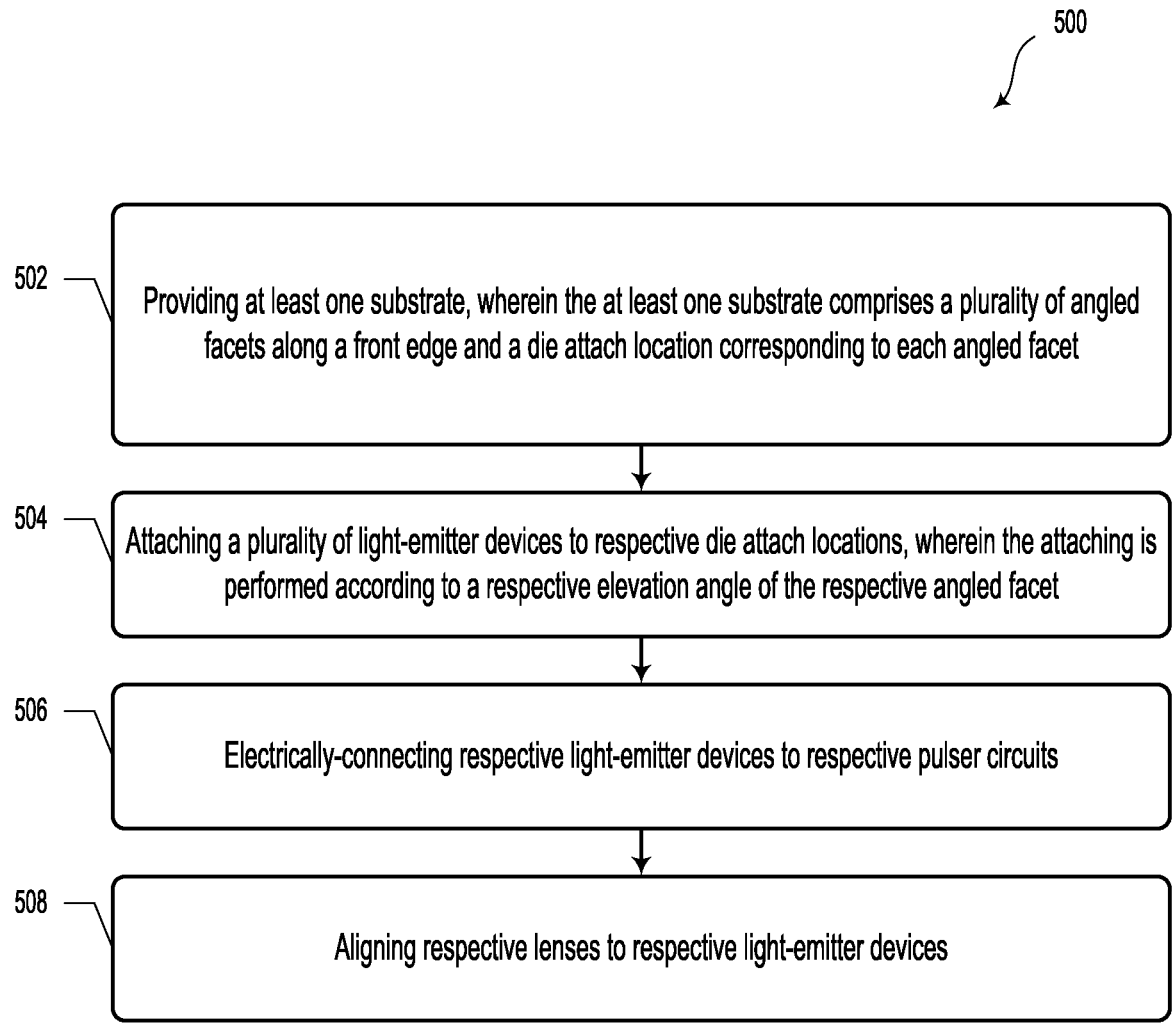
FIG. 5 illustrates a method, according to an example embodiment.

FIG. 4E illustrates further portions of method 500, according to an example embodiment. Namely, the method 500 may include attaching, assembling, or otherwise providing additional elements, such as alignment features 424, communication interface 422, socket 421, and other electronic components 423a and 423b.

In some embodiments, method 500 may include aligning a plurality of substrates 410 to one another. For example, the plurality of substrates may be aligned by way of the alignment features 424 and/or with any combination of alignment pins, standoffs, fiducials, or other structures configured to reliably align the substrates with respect to one another and maintain such alignment during operation of optical system 400. In such a scenario, each of the substrates may include respective pluralities of angled facets, which in combination may provide a plurality of unique elevation angles over a non-linear angle distribution as described herein.

Figure 6A:
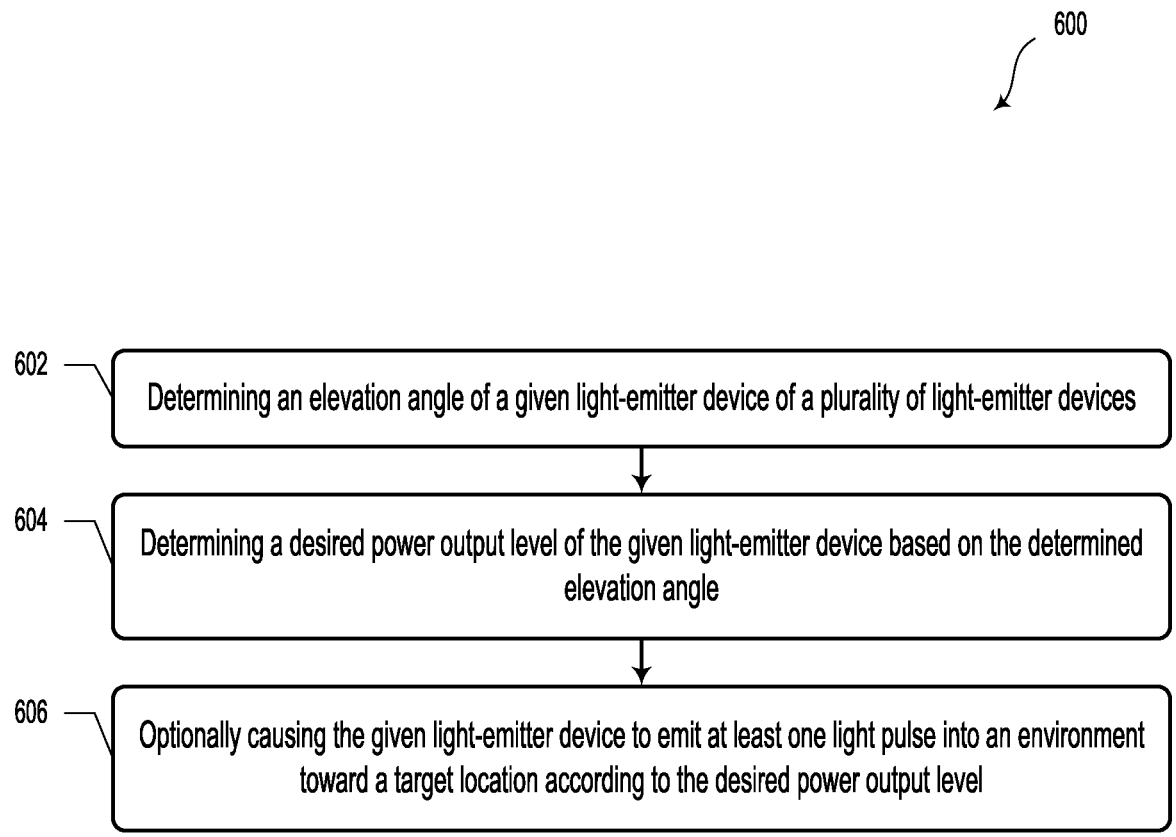
FIG. 6A illustrates a method, according to an example embodiment.

FIG. 6A illustrates a method 600, according to an example embodiment.

Method 600 may provide a way to adjust a power level of a given light pulse or pulse train emitted by a given light-emitter device based on a respective elevation angle of the light-emitter device. Method 600 may involve elements that are similar or identical to those illustrated and described in reference to FIGS. 1A, 1B, 2A, 2B, 2C, 3A, and/or 3B. It will be understood that the method 600 may include fewer or more steps or blocks than those expressly described herein. Furthermore, respective steps or blocks of method 600 may be performed in any order and each step or block of method 600 may be performed one or more times. In some embodiments, method 600 may be combined with one or more of methods 500, 700, 800, or 900.

Block 602 includes determining an elevation angle of a given light-emitter device of a plurality of light-emitter devices. In such a scenario, the respective light-emitter devices are coupled to respective die attach locations corresponding to respective angled facets of a plurality of angled facets disposed along a front edge of at least one substrate. In some embodiments, determining the elevation angle of the given light-emitter device may be based on an arrangement of the respective light-emitter device on the at least one substrate, as described elsewhere herein.

Block 604 includes determining a desired power output level of the given light-emitter device based on the determined elevation angle. In some embodiments, the desired power output level could be increased or decreased from a standard power output level based on the determined elevation angle. In some embodiments, the standard power output level could include a default power per shot that the LIDAR may provide for shots with an elevation angle above a reference plane (e.g., the horizontal plane). In such scenarios, the elevation angle may limit a distance that a given light pulse may travel before it interacts with a ground surface or a physical object. For example, the desired power output level may be decreased in cases where, for example, the elevation angle is below the horizontal plane (zero degrees) or below −5 degrees from the horizontal. In other scenarios, the desired power output level may be increased when the determined elevation angle is above, for example, −5 degrees or the horizontal plane (zero degrees).

In some example embodiments, determining the desired power output level may be further based on a comparison between the determined elevation angle and at least one value in a lookup table. In some instances, the lookup table may be stored in memory 154 and may be updated dynamically based on, for example, real-time or historic point cloud data.

Optional Block 606 includes causing the given light-emitter device to emit at least one light pulse into an environment toward a target location according to the desired power output level. For example, a pulser circuit may cause a laser diode to emit a light pulse or a plurality of light pulses (e.g., a pulse train). In such a scenario, each light pulse may be emitted at a power level that is based on the elevation angle of the emitted light. In some embodiments, light pulses with elevation angles below a reference plane (e.g., the horizontal plane) may be emitted with lower power than light pulses with elevation angles above the reference plane.

In some embodiments, method 600 may include determining a region of interest in the environment. In such scenarios, determining the desired power output level is further based on determining that the region of interest corresponds to the target location of the given light-emitter device. For example, if a region of interest is determined, the power output level of a given light pulse of a light-emitter device with a target location that corresponds to the region of interest may be adjusted to be greater or less than a normal value.

A region of interest may relate to a possible object within the environment of an autonomous vehicle, such as vehicle 300 as illustrated and described with reference to FIG. 3B.

In some embodiments, method 600 may also include receiving information indicative of a reference angle. In such cases, determining the elevation angle may be based on the received information. The reference angle could relate to, for example, a forward movement direction of the vehicle 300. For instance, the forward movement direction of the vehicle 300 may change as the vehicle moves along a hilly road. In such a scenario, more power may be applied to at least some laser pulses that are emitted at a higher effective elevation angle (e.g., due to the vehicle going up a hill) at least because the laser pulse may travel a longer distance (and be subject to more scattering and other interference effects) compared to if the vehicle was traveling along a flat surface. Conversely, in some situations, less power may be applied to at least some laser pulses, which may be emitted at a lower effective elevation angle (e.g., due to the vehicle moving down a hill). In such scenarios, the laser pulses may travel a shorter distance before interacting with an object, and may thus operate acceptably with less power than in a flat-surface scenario.

Figure 6B:
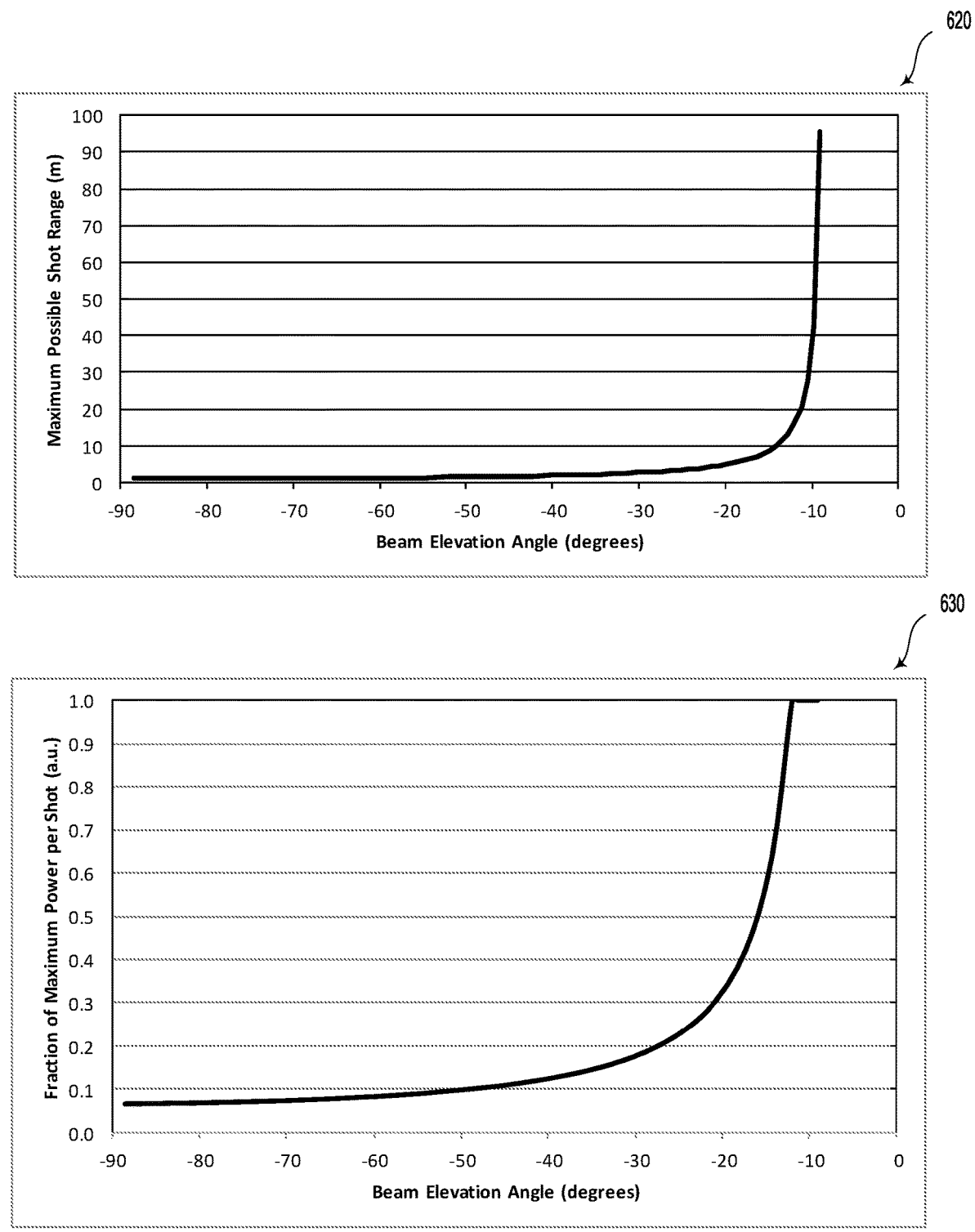
FIG. 6B illustrates graphs, according to an example embodiment.

FIG. 6B illustrates graphs 620 and 630, according to an example embodiment. Graph 620 illustrates a maximum possible shot range in meters versus beam elevation angle in degrees for a LIDAR system at a given height (e.g., 2 meters). For example, for a beam pitch of −88.5 degrees, that is, a beam that is pointed almost directly downwards may have a maximum possible shot range of 0.98 meters. That is, light pulses emitted by a light-emitter device angled downward at −88.5 degrees would normally interact with the ground after traveling 0.98 meters at the most, assuming the vehicle and LIDAR system is tilted less than a threshold angle from the ground surface. In such a scenario, the round trip of a reflected portion of the light pulses may be approximately 2 meters. Of course, the light pulses may interact with an object located above the ground surface, which would result in a shorter return trip. In either case, the short round trip distance of the light pulses may allow the use of relatively little power at least because of a shorter interaction distance with light attenuating/scattering media (e.g., air, dust, etc.).

Accordingly, as illustrated by graph 630, the power provided to the given light-emitter to provide a given signal to noise ratio may be much less (e.g., 6.7% standard power) than that of, for example, a light-emitter device with a beam pitch of −10 degrees (100% standard power). As such, the downward angle of the beam pitch provides a maximum threshold distance at the ground surface boundary. Based on this maximum distance, the power can be decreased to maintain reliable object detection without wasting excess power.

It will be understood that graphs 620 and 630 illustrate an example embodiment and that many other variations are possible. For example, the individual beam pitches may vary, as well as the angular range of beam pitches. Furthermore, the power fraction assigned to a given beam pitch may vary based on, without limitation, surrounding topography, objects in the environment, a mounting height of the sensor unit, a speed and/or direction of motion of the vehicle, a background light level, an emission wavelength, a charge level of a battery that provides the light-emitter devices with power, an operational age of the respective light-emitter devices, among other considerations.

Figure 7:
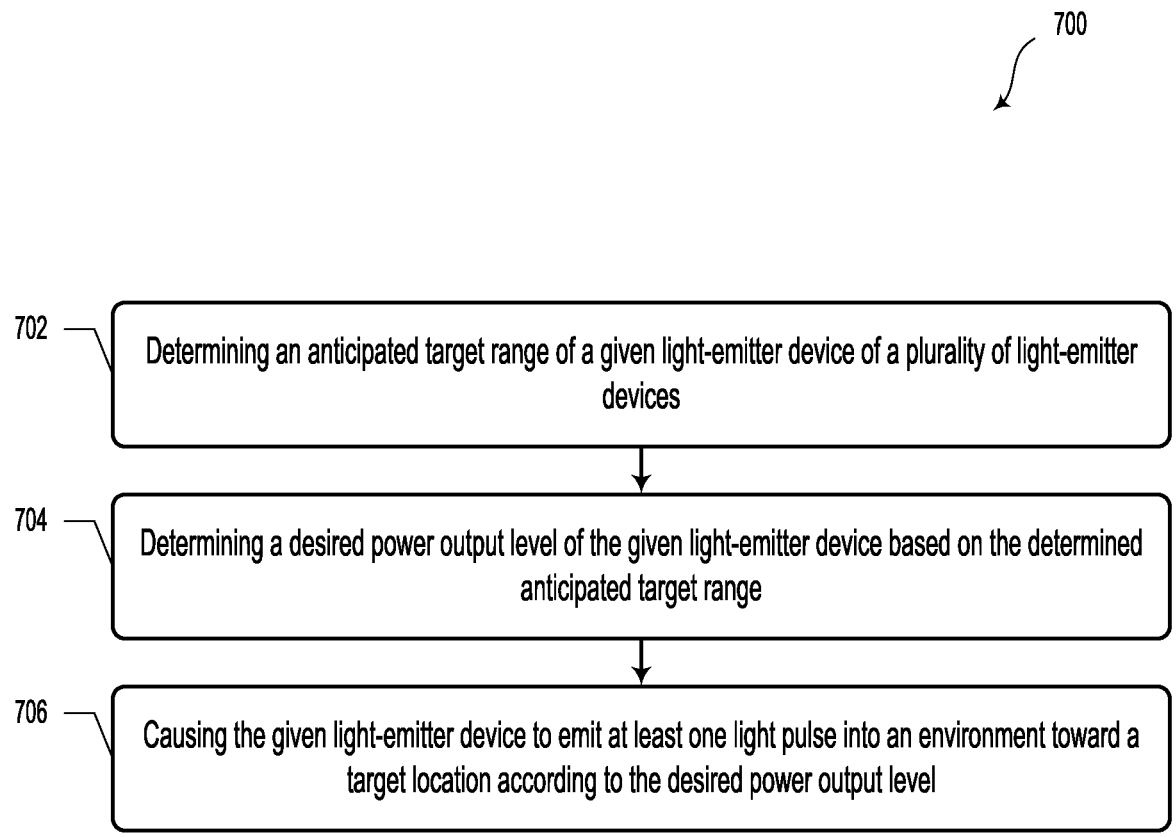
FIG. 7 illustrates a method, according to an example embodiment.

FIG. 7 illustrates a method 700, according to an example embodiment. Method 700 may provide a way to adjust a power level of a given light pulse or pulse train emitted by a given light-emitter device based on an anticipated target range. Method 700 may involve elements that are similar or identical to those illustrated and described in reference to FIGS. 1A, 1B, 2A, 2B, 2C, 3A, and/or 3B. It will be understood that the method 700 may include fewer or more steps or blocks than those expressly disclosed herein. Furthermore, respective steps or blocks of method 700 may be performed in any order and each step or block of method 700 may be performed one or more times. In some embodiments, method 700 may be combined with one or more of methods 500, 600, 800, or 900.

Block 702 includes determining an anticipated target range of a given light-emitter device of a plurality of light-emitter devices. The respective light-emitter devices are coupled to respective die attach locations corresponding to respective angled facets of a plurality of angled facets disposed along a front edge of at least one substrate. The anticipated target range could be based, at least in part, on the respective arrangements of light-emitter devices on the at least one substrate. The anticipated target range could be additionally or alternatively based on a ground surface. In other embodiments, the anticipated target range could be additionally or alternatively based on historical point cloud data and/or target object recognition information. That is, an anticipated target range may relate to a previously-scanned, and/or specifically identified, target object. In other words, the anticipated target range could be based on information obtained from an earlier scan by the LIDAR device, another LIDAR device or another vehicle at an earlier time.

Block 704 includes determining a desired power output level of the given light-emitter device based on the determined anticipated target range. In some embodiments, determining the desired power output level may be further based on a comparison between the anticipated target range and at least one value in a lookup table, which could be similar or identical to table 620 as illustrated and described with regard to FIG. 6B. In some instances, the lookup table may be stored in memory 154 and may be updated dynamically based on, for example, real-time or historic point cloud data. For instance, real-time point cloud data during a first LIDAR scan may provide locations of physical objects with the environment of the vehicle. Some or all of the physical objects may be designated as anticipated targets, because they will likely be rescanned in subsequent LIDAR scans. Additionally or alternatively, anticipated targets may be determined based on map data and/or a current location of the vehicle or LIDAR device. As such, an appropriate power output level may be adjusted based on an anticipated location of the target object. That is, light pulses anticipated to interact with target objects close to the vehicle may include relatively less power than those light pulses anticipated to interact with target objects far from the vehicle.

Optional Block 706 includes causing the given light-emitter device to emit at least one light pulse into an environment toward a target location according to the desired power output level.

In some embodiments, method 700 includes determining a region of interest in the environment. As an example, determining the desired power output level may be further based on determining that the region of interest corresponds to the target location of the given light-emitter device.

In some embodiments, method 700 may include receiving information indicative of a reference angle. In such scenarios, determining the anticipated target range may be based on the received information. As described above, the reference angle could relate to, for example, a forward movement direction of the vehicle 300. In such a scenario, more power may be applied to at least some laser pulses that are emitted at a higher effective elevation angle (e.g., due to the vehicle going up a hill) at least because the laser pulse may travel a longer anticipated target distance (and be subject to more scattering and other interference effects) compared to if the vehicle was traveling along a flat surface. Conversely, in some situations, less power may be applied to at least some laser pulses, which may be emitted at a lower effective elevation angle (e.g., due to the vehicle moving down a hill). In such scenarios, the laser pulses may travel a shorter anticipated target distance before interacting with an object or target, and may thus be effectively detected using less power than in a flat-surface scenario.

Figure 8:
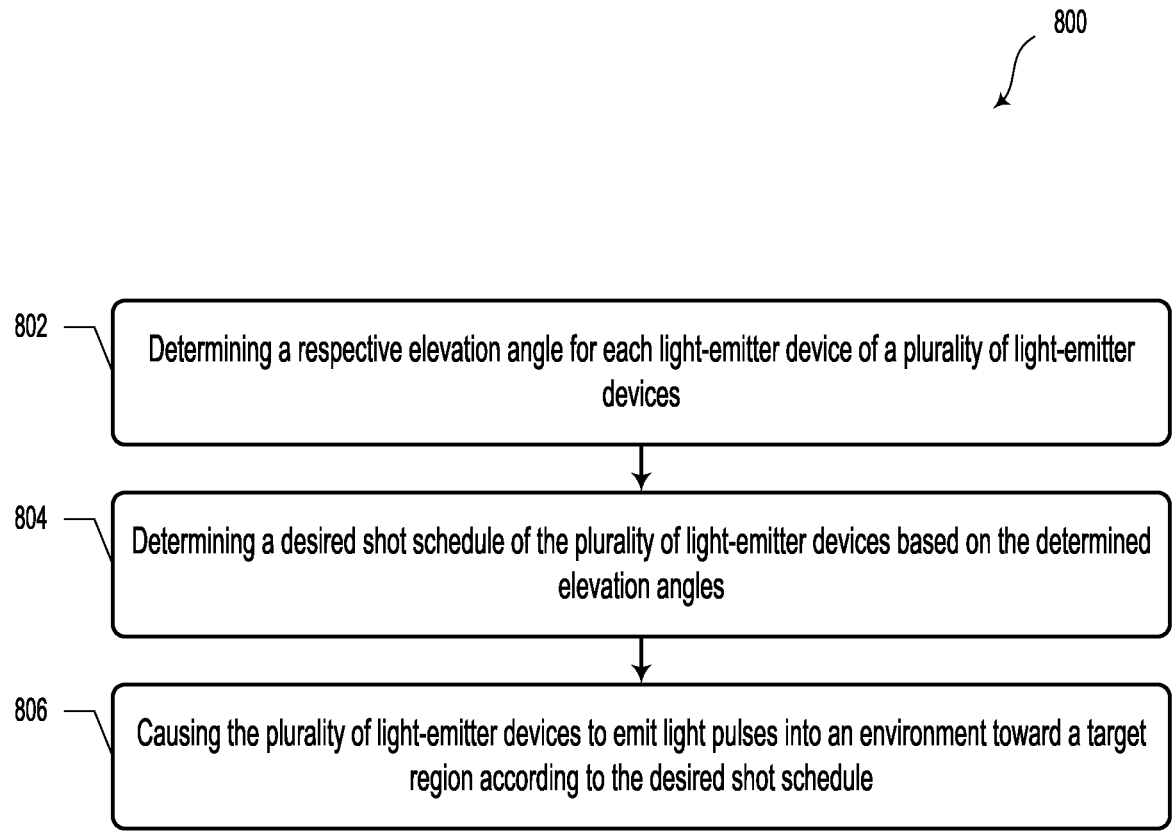
FIG. 8 illustrates a method, according to an example embodiment.

FIG. 8 illustrates a method 800, according to an example embodiment. Method 800 may provide a way to adjust a desired shot schedule of a given light pulse or pulse train emitted by a given light-emitter device based on a respective elevation angle of the light-emitter device. Method 800 may involve elements that are similar or identical to those illustrated and described in reference to FIGS. 1A, 1B, 2A, 2B, 2C, 3A, and/or 3B. It will be understood that the method 800 may include fewer or more steps or blocks than those expressly disclosed herein. Furthermore, respective steps or blocks of method 800 may be performed in any order and each step or block of method 800 may be performed one or more times. In some embodiments, method 800 may be combined with one or more of methods 500, 600, 700, or 900.

Block 802 includes determining an elevation angle for each light-emitter device of a plurality of light-emitter devices. In such a scenario, respective light-emitter devices are coupled to respective die attach locations corresponding to respective angled facets of a plurality of angled facets disposed along a front edge of at least one substrate. In some embodiments, determining the elevation angle of the light-emitter devices may be based on an arrangement of the respective light-emitter device on the at least one substrate, as described elsewhere herein.

Block 804 includes determining a desired shot schedule of the given light-emitter device based on the determined elevation angle. In some embodiments, the desired shot rate could be increased or decreased from a standard shot rate based on the determined elevation angle. The desired shot schedule may indicate 1) which light-emitter of the plurality of light-emitter devices is to be fired; 2) how long the light-emitter should be fired (e.g., a time duration of a given light pulse); and/or 3) how long to wait before firing the next light-emitter. In such scenarios, the elevation angle may limit a distance that a given light pulse may travel before it interacts with a ground surface or a physical object. For example, the desired shot schedule may be adjusted to decrease the time to wait after firing a light pulse from a downward-pointing light-emitter device, in cases where, for example, the elevation angle is below the horizontal plane (zero degrees) or below −5 degrees from the horizontal. In other scenarios, the desired shot schedule may be adjusted to increase the time to wait after firing a light pulse from an upward-pointing light-emitter device when the determined elevation angle is above, for example, −5 degrees or the horizontal plane (zero degrees).

In some embodiments, determining the desired shot schedule may be further based on a comparison between the elevation angle and at least one value in a lookup table. In some instances, the lookup table may be stored in memory 154 and may be updated dynamically based on, for example, real-time or historic point cloud data.

Optional Block 806 includes causing the plurality of light-emitter devices to emit light pulses into an environment toward a target region or region of interest according to the desired shot schedule. For example, a pulser circuit may cause laser diodes to emit a light pulse or a plurality of light pulses (e.g., a pulse train) according to the desired shot schedule (e.g., firing the laser diodes in a given order, with a given pulse duration, and with a given wait time before the next light pulse).

In some embodiments, method 800 may include determining a region of interest in the environment. In such scenarios, determining the desired shot rate is further based on determining that the region of interest corresponds to the target region of the given light-emitter device. As described elsewhere herein, the region of interest may include, but need not be limited to, a vehicle, an object, a person or another living being, an obstacle, a traffic sign, a hazard cone, or another type of feature within the environment of the sensor system that may represent important information relating to the operation of the sensor system or the vehicle to which it is mounted.

In some embodiments, method 800 may include receiving information indicative of a reference angle. In such scenarios, determining the elevation angles may be based on the received information.

Figure 9:
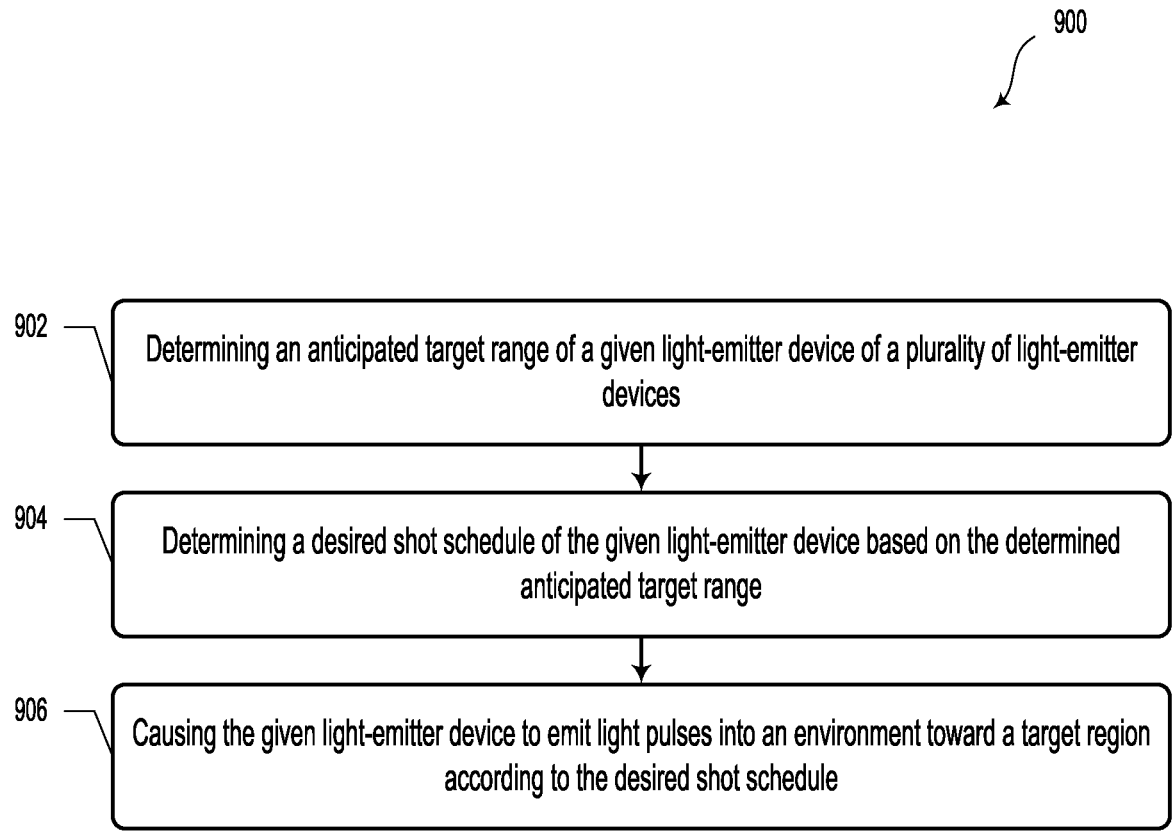
FIG. 9 illustrates a method, according to an example embodiment.

FIG. 9 illustrates a method 900, according to an example embodiment. Method 900 may provide a way to adjust a desired shot schedule of a plurality of light-emitter devices based on an anticipated target range. As described above, the desired shot schedule may indicate 1) which light-emitter of the plurality of light-emitter devices is to be fired; 2) how long the light-emitter should be fired (e.g., a time duration of a given light pulse); and/or 3) how long to wait before firing the next light-emitter. Method 900 may involve elements that are similar or identical to those illustrated and described in reference to FIGS. 1A, 1B, 2A, 2B, 2C, 3A, and/or 3B. It will be understood that the method 900 may include fewer or more steps or blocks than those expressly disclosed herein. Furthermore, respective steps or blocks of method 900 may be performed in any order and each step or block of method 900 may be performed one or more times. In some embodiments, method 900 may be combined with one or more of methods 500, 600, 700, or 800.

Block 902 includes determining an anticipated target range for each light-emitter device of a plurality of light-emitter devices. The respective light-emitter devices are coupled to respective die attach locations corresponding to respective angled facets of a plurality of angled facets disposed along a front edge of at least one substrate. The anticipated target ranges could be based, at least in part, on the respective arrangements of light-emitter devices on the at least one substrate. The anticipated target ranges could be additionally or alternatively based on a ground surface. In other embodiments, the anticipated target ranges could be based on historical point cloud data and/or target object recognition information. That is, the anticipated target ranges may relate to a previously-scanned, and/or specifically identified, target object, which could have been scanned by the same or another LIDAR device at an earlier time.

Block 904 includes determining a desired shot schedule of the plurality of light-emitter devices based on the respective determined anticipated target ranges. In other words, the desired shot schedule could be adjusted from a standard shot schedule (e.g., raster-scan sequential emitter firing, standard pulse duration, standard wait time before next pulse, etc.) based on an anticipated range to a given target or possible target. For example, the wait time between pulses may be decreased in cases where, for example, the anticipated target is at relatively close range (e.g., within 5 meters of the front bumper). In other scenarios, the wait time between pulses may be increased when an anticipated target is at relative long range (e.g., more than 25 meters from the front bumper).

In some embodiments, determining the desired shot schedule may be further based on a comparison between the respective anticipated target ranges and at least one value in a lookup table. In some instances, the lookup table may be stored in memory 154 and may be updated dynamically based on, for example, real-time or historic point cloud data.

Optional Block 906 includes causing the plurality of light-emitter devices to emit light pulses into an environment toward a target region according to the desired shot schedule. For example, a pulser circuit may cause laser diodes to emit a light pulse or a plurality of light pulses (e.g., a pulse train) according to the desired shot schedule (e.g., firing the laser diodes in a given order, with a given pulse duration, and with a given wait time before the next light pulse).

In some embodiments, method 900 may include determining a region of interest in the environment, wherein determining the desired shot schedule is further based on determining that the region of interest corresponds to the target region of at least one light-emitter device of the plurality of light-emitter devices.

The method 900 may include receiving information indicative of a reference angle. For example, determining the respective anticipated target ranges may be based on the received information.

The particular arrangements shown in the Figures should not be viewed as limiting. It should be understood that other embodiments may include more or less of each element shown in a given Figure. Further, some of the illustrated elements may be combined or omitted. Yet further, an illustrative embodiment may include elements that are not illustrated in the Figures.

A step or block that represents a processing of information can correspond to circuitry that can be configured to perform the specific logical functions of a herein-described method or technique. Alternatively or additionally, a step or block that represents a processing of information can correspond to a module, a segment, a physical computer (e.g., a field programmable gate array (FPGA) or application-specific integrated circuit (ASIC)), or a portion of program code (including related data). The program code can include one or more instructions executable by a processor for implementing specific logical functions or actions in the method or technique. The program code and/or related data can be stored on any type of computer readable medium such as a storage device including a disk, hard drive, or other storage medium.

The computer readable medium can also include non-transitory computer readable media such as computer-readable media that store data for short periods of time like register memory, processor cache, and random access memory (RAM). The computer readable media can also include non-transitory computer readable media that store program code and/or data for longer periods of time. Thus, the computer readable media may include secondary or persistent long term storage, like read only memory (ROM), optical or magnetic disks, compact-disc read only memory (CD-ROM), for example. The computer readable media can also be any other volatile or non-volatile storage systems. A computer readable medium can be considered a computer readable storage medium, for example, or a tangible storage device.

While various examples and embodiments have been disclosed, other examples and embodiments will be apparent to those skilled in the art. The various disclosed examples and embodiments are for purposes of illustration and are not intended to be limiting, with the true scope being indicated by the following claims.

What is claimed is:

1. A Light Detection and Ranging (LIDAR) device comprising:
    at least one substrate, wherein the at least one substrate comprises a plurality of substrates, and wherein the plurality of substrates are physically arranged in a non-parallel arrangement; and
    a plurality of light sources arranged along the at least one substrate, wherein:
        each substrate of the plurality of substrates has coupled thereon at least one light source of the plurality of light sources,
        a set of angle differences between beam elevation angles of adjacent light sources comprises a non-uniform beam elevation angle distribution with respect to the environment,
        at least two of the light sources of the plurality of light sources are arranged along different azimuth angles; and
        light is emitted from the plurality of light sources such that a pointing direction of the plurality of light sources converges toward a desired target location in both an elevation direction and azimuthal direction.

2. The LIDAR device of claim 1, wherein the plurality of substrates comprises six substrates coupled by way of one or more fiducial pins and/or standoffs.

3. The LIDAR device of claim 1, wherein each light source of the plurality of light sources is oriented along a respective substrate of the plurality of substrates at a respective pointing angle, wherein the respective pointing angle comprises an elevation angle component and an azimuthal angle component.

4. The LIDAR device of claim 1, further comprising:
    a plurality of lenses, wherein each lens of the plurality of lenses is aligned with a respective light source of the plurality of light sources, and wherein each lens controls the pointing direction of the respective light source such that light is emitted from the light source toward a desired target location.

5. The LIDAR device of claim 4, wherein each lens of the plurality of lenses comprises an optical element, and wherein each optical element is coupled to a respective facet of a respective light source.

6. The LIDAR device of claim 5, wherein each optical element is configured to focus, steer, collimate, or otherwise interact with light emitted from an emitting surface of a respective light source.

7. The LIDAR device of claim 5, wherein the facets are provided along an edge surface of respective substrates.

8. The LIDAR device of claim 5, wherein adjusting a position of a given optical element adjusts a corresponding pointing angle of a given light source.

9. The LIDAR device of claim 3, wherein the plurality of pointing angles ranges from approximately −5 degrees to +5 degrees with respect to an orientation of at least one substrate of the plurality of substrates.

10. The LIDAR device of claim 1, wherein the plurality of light sources comprises at least 64 light-emitter devices.

11. The LIDAR device of claim 1, further comprising, a plurality of pulser circuits, wherein a given pulser circuit corresponds to a given light source of the plurality of light sources, wherein each respective pulser circuit is configured to accept a power signal, an enable signal, and a trigger signal, wherein the respective pulser circuits are configured to provide pulses between 1-10 nanoseconds in duration.

12. The LIDAR device of claim 1, wherein the LIDAR device is coupled to a vehicle, wherein the plurality of light sources is configured to emit light into an environment around the vehicle.

13. The LIDAR device of claim 1, wherein a first set of light sources have respective beam elevation angles above a horizontal reference plane and a second set of light sources have respective beam elevation angles below the reference plane.

14. The LIDAR device of claim 13, wherein less than 50% of the plurality of light sources have respective beam elevation angles below the reference plane.

15. The LIDAR device of claim 13, wherein the light sources with respective elevation angles below the reference plane are configured to emit light pulses at a higher shot rate than the light sources with respective elevation angles above the reference plane.

16. The LIDAR device of claim 13, wherein the light sources with respective elevation angles above the reference plane are configured to emit light pulses with a lower duty cycle than the light sources with respective elevation angles below the reference plane.

17. The LIDAR device of claim 13, wherein the light sources with respective elevation angles above the reference plane are configured to emit light pulses with a higher power output per pulse than the light sources with respective elevation angles below the reference plane.

18. The LIDAR device of claim 13, wherein the light sources with respective elevation angles above the reference plane are configured to emit light pulses with a first desired shot schedule, wherein the light sources with respective elevation angles below the reference plane are configured to emit light pulses with a second desired shot schedule.

19. The LIDAR device of claim 18, wherein the respective desired shot schedules comprise at least one of: 1) which light source of the plurality of light sources is to be fired; 2) how long the light source should be fired; or 3) how long to wait before firing the next light source.

20. The LIDAR device of claim 1, wherein the pointing direction of the plurality of light sources is partially determined by the non-parallel arrangement of the plurality of substrates.

* * * * *